United States Patent
Li

(10) Patent No.: US 9,859,907 B1
(45) Date of Patent: Jan. 2, 2018

(54) SYSTEMS AND METHODS FOR REMOVING ERRORS IN ANALOG TO DIGITAL CONVERTER SIGNAL CHAIN

(71) Applicant: Analog Devices, Inc., Norwood, MA (US)

(72) Inventor: Hongxing Li, Andover, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 15/337,774

(22) Filed: Oct. 28, 2016

(51) Int. Cl.
*H03M 1/06* (2006.01)
*H03M 1/12* (2006.01)
*H03M 1/10* (2006.01)

(52) U.S. Cl.
CPC ........ *H03M 1/0617* (2013.01); *H03M 1/1009* (2013.01); *H03M 1/1245* (2013.01)

(58) Field of Classification Search
CPC ........ H03M 3/34; H03M 1/12; H03M 1/1215; H03M 1/0607; H03M 1/1023; H03M 1/0663; H03M 1/1295; H03M 1/682; H03M 3/458; H03M 1/0673; H03M 1/08; H03M 1/1009
USPC .......................... 341/118–121, 141, 142, 155
See application file for complete search history.

(56) References Cited

U.S. PATENT DOCUMENTS

| | | | |
|---|---|---|---|
| 4,994,804 A * | 2/1991 | Sakaguchi | H03M 3/34 341/143 |
| 6,201,835 B1 | 3/2001 | Wang | |
| 6,236,275 B1 | 5/2001 | Dent | |
| 6,404,367 B1 | 6/2002 | Van der Zwan et al. | |
| 6,411,242 B1 | 6/2002 | Oprescu et al. | |
| 6,900,750 B1 * | 5/2005 | Nairn | H03M 1/0621 341/118 |
| 7,006,028 B2 | 2/2006 | Galton | |
| 7,061,406 B1 * | 6/2006 | Dally | H03M 5/12 341/50 |
| 7,250,886 B1 * | 7/2007 | Killat | H03K 17/0416 341/143 |
| 7,301,486 B2 * | 11/2007 | Wang | H03M 1/1004 341/118 |

(Continued)

FOREIGN PATENT DOCUMENTS

CN 103023502 A 4/2013

OTHER PUBLICATIONS

McNeill, John, et al., ""Split ADC" Architecture for Deterministic Digital Background Calibration of a 16-bit 1-MS/s ADC", *IEEE Journal of Solid-State Circuits*, vol. 40, No. 12, (Dec. 2005), 2437-2445.

*Primary Examiner* — Linh Nguyen
(74) *Attorney, Agent, or Firm* — Schwegman Lundberg & Woessner, P.A.

(57) ABSTRACT

An analog to digital converter (ADC) system includes two signal paths in parallel with each other, where the signal paths include separate ADC circuits to separately operate on a same input signal and output separate digital signals. A difference signal is calculated as a difference of the digital signals output from the two signal paths to determine an error present in one or both of the signal paths. The error may be modulated in one or both of the signal paths and demodulated from the difference signal according to a same digital modulation pattern to compute an error compensation signal to compensate for at least one of the modulated error and a secondary error resulting from the modulation of the error.

22 Claims, 10 Drawing Sheets

(56) References Cited

U.S. PATENT DOCUMENTS

| | | | |
|---|---|---|---|
| 7,312,734 B2 | 12/2007 | McNeill et al. | |
| 7,511,652 B1 * | 3/2009 | Liu | H03K 5/24 |
| | | | 341/120 |
| 7,545,302 B1 * | 6/2009 | Silva | G06J 1/00 |
| | | | 341/143 |
| 7,714,757 B2 | 5/2010 | Denison et al. | |
| 7,839,316 B2 * | 11/2010 | Balachandran | H03F 3/393 |
| | | | 341/155 |
| 7,999,710 B2 * | 8/2011 | Matthews | H03M 3/34 |
| | | | 341/143 |
| 8,829,988 B2 | 9/2014 | Motz et al. | |
| 9,203,363 B2 | 12/2015 | Motz et al. | |
| 2005/0156769 A1 * | 7/2005 | O'Dowd | H03M 3/34 |
| | | | 341/143 |
| 2006/0176197 A1 * | 8/2006 | McNeill | H03M 1/1004 |
| | | | 341/120 |
| 2007/0194960 A1 * | 8/2007 | Wang | H03M 1/1004 |
| | | | 341/120 |
| 2011/0102228 A1 * | 5/2011 | Anthony | H03M 1/0607 |
| | | | 341/155 |
| 2012/0262317 A1 | 10/2012 | Motz et al. | |
| 2014/0139285 A1 | 5/2014 | Maderbacher et al. | |

* cited by examiner

SYSTEMS AND METHODS FOR REMOVING ERRORS IN ANALOG TO DIGITAL CONVERTER SIGNAL CHAIN

FIELD OF THE DISCLOSURE

The present disclosure relates to the field of analog to digital converter circuits and systems.

BACKGROUND

In analog to digital converter (ADC) circuits and systems, chopping can be used to remove voltage offset at amplifier inputs and 1/f noise (e.g., low frequency noise). In chopping a differential input signal, the two polarities of the differential input to the amplifier can be swapped with each other at a given frequency or interval. Chopping modulates a low frequency error in the input signal, resulting in ripple in the ADC output signal. This ripple can be removed by choosing a chopping frequency high enough to place the ripple outside the signal band of the input signal so that it may be filtered out of the output signal, and then filtering the output signal to remove the ripple.

SUMMARY OF THE DISCLOSURE

The present inventors have recognized, among other things, that problems can arise when chopping analog signals input to an analog to digital converter (ADC) circuit, including creating ripples in the output signals. These ripples may be considered as a type of error in the signal chain, related to an input voltage offset. In one approach, these ripples can be suppressed by various techniques including chopping the input signal at a frequency higher than the input signal and oversampling by the ADC circuit to place the ripple outside of the signal band, and applying a digital filter to the ADC circuit's output signal to remove the ripple. However, this approach leads to more complicated and larger circuits that consume more power. In addition, chopping at higher frequencies leads to generation of greater input bias currents, which exacerbates the problem. There is therefore a need for better approaches to remove errors in a signal chain without increasing chopping frequencies.

In various embodiments, errors in a signal chain may be removed in either the analog domain or the digital domain and in the background (e.g., while the ADC system is normally operating as opposed to prior to the ADC system operating) such as by calibrating and modulating the errors to turn the errors into noise to avoid corruption in the signal band. Once the errors are tracked and corrected, the modulation frequency may be placed in the signal frequency band because the errors will be suppressed sufficiently that they are no longer visible in the output signal. In addition, the chopping frequency may also be within the signal frequency band.

According to various embodiments, two signal chains may process a same analog input signal separately and in parallel with each other to produce two independent digital output signals. A difference signal may be generated by subtracting one of the two digital output signals from the other to expose differences between the two signal chains by effectively removing the digital representation of the analog input signal. The exposed differences between the two signal chains may include noise and errors. When chopping is performed in the two signal chains, errors due to the chopping may be included within the errors exposed in the difference signal. By modulating each error in the two signal chains by a modulation pattern that is uncorrelated with the modulation patterns used to modulate the other errors, information regarding each error may be recovered from the difference signal by demodulating each error using the same modulation pattern used to modulate the respective error and filtering the results. The errors may then be corrected in either the analog domain at their source or the digital domain after conversion by the ADC circuit. In embodiments where the chopping of an input signal modulates a source of an error, e.g., a voltage offset error or an asymmetric charge injection error, the chopping frequency may be modulated by a modulation pattern so that the error may be detected and the detected error may be compensated by adding a compensation signal based on the detected error to the source of the error in the analog domain or applying the compensation signal to the digital output signal in the digital domain.

This technique may be applied to any error in the signal chain that is relatively stable within a calibration window of time. By suppressing the error, e.g., the ripple due to chopping or signal transients coincident with chopping, the modulation or chopping frequency may be placed within the signal band, thereby simplifying the ADC system and improving performance, including improved low drift offsets.

According to an embodiment, an analog to digital converter (ADC) system includes two signal paths in parallel with each other. The signal paths include separate front end circuits respectively cascaded with separate ADC circuits to separately operate on a same input signal and output separate digital signals. A difference signal may be calculated as a difference of the digital signals output from the two signal paths such as to determine an error present in one or both of the signal paths. The error may be modulated in one or both of the two signal paths and demodulated from the difference signal according to a same digital modulation pattern to compute an error compensation signal to compensate for the error.

According to an embodiment, an ADC system for removing errors in a signal chain includes separate first and second analog front end circuits having inputs coupled together to receive a same analog input signal. The first and second analog front end circuits are respectively cascaded with separate first and second ADC circuits to separately convert the analog input signal into first and second digital signals. The ADC system also includes a modulator circuit to modulate an error in a signal path between an input of at least one of the first and second analog front end circuits and an output of at least one of the first and second ADC circuits according to a digital modulation pattern. The ADC system also includes a difference circuit to generate a difference signal from the first and second digital signals, and a demodulator circuit to demodulate the difference signal according to the digital modulation pattern to compute an error compensation signal to compensate for the error.

According to an embodiment, a method of removing errors in a signal chain of an ADC system includes receiving a same analog input signal by separate first and second analog front end circuits, separately processing the analog input signal by the separate first and second analog front end circuits, separately converting the processed analog input signal into first and second digital signals by respective separate first and second ADC circuits, modulating an error in a signal path between an input of at least one of the first and second analog front end circuits and an output of at least one of the first and second ADC circuits by a modulator circuit according to a digital modulation pattern, generating a difference signal from the first and second digital signals by a difference circuit, and demodulating the difference signal according to the digital modulation pattern to compute an error compensation signal to compensate for the error, wherein the demodulating is performed by a demodulator circuit.

According to an embodiment, an ADC system for removing errors in a signal chain includes a first signal chain having a first analog signal input along a first signal path and having a first digital signal output along the first signal path downstream of the first analog signal input. The first analog signal input is to receive an input signal and the first digital signal output is to output a first digital signal. The first digital signal is a digital representation of the input signal. The first signal chain includes a first amplifier circuit having an input coupled with the first signal path downstream of the first analog signal input and having an output coupled with the first signal path downstream of the input of the first amplifier circuit, a first ADC circuit having an input coupled with the first signal path downstream of the first amplifier circuit and having an output coupled with the first signal path downstream of the input of the first ADC circuit and upstream of the first digital signal output, and a first modulating chopper circuit having an input coupled with the first signal path downstream of the first analog signal input and having an output coupled with the first signal path downstream of the input of the first modulating chopper circuit and upstream of the output of the first ADC circuit. The first modulating chopper circuit is controlled to perform chopping according to a first chopping sequence. The ADC system for removing errors in a signal chain also includes a second signal chain having a second analog signal input along a second signal path and having a second digital signal output along the second signal path downstream of the second analog signal input. The second analog signal input is to receive the input signal and the second digital signal output is to output a second digital signal. The second digital signal is a digital representation of the input signal. The second digital signal is a digital representation of the input signal. The second signal chain includes a second amplifier circuit having an input coupled with the second signal path downstream of the second analog signal input and having an output coupled with the second signal path downstream of the input of the second amplifier circuit, a second ADC circuit having an input coupled with the second signal path downstream of the second amplifier circuit and having an output coupled with the second signal path downstream of the input of the second ADC circuit and upstream of the second digital signal output, and a second modulating chopper circuit having an input coupled with the second signal path downstream of the second analog signal input and having an output coupled with the second signal path downstream of the input of the second modulating chopper circuit and upstream of the output of the second ADC circuit. The second modulating chopper circuit is controlled to perform chopping according to a second chopping sequence. The ADC system for removing errors in a signal chain also includes a difference circuit that subtracts the second digital signal output by the second signal chain from the first digital signal output by the first signal chain to output a difference signal, and an error estimator circuit that computes an error compensation signal to compensate for the error by demodulating the difference signal by a demodulator circuit according to at least one of the first chopping sequence and the second chopping sequence.

This overview is intended to provide an overview of subject matter of the present patent application. It is not intended to provide an exclusive or exhaustive explanation of the invention. The detailed description is included to provide further information about the present patent application.

Figure 1A:
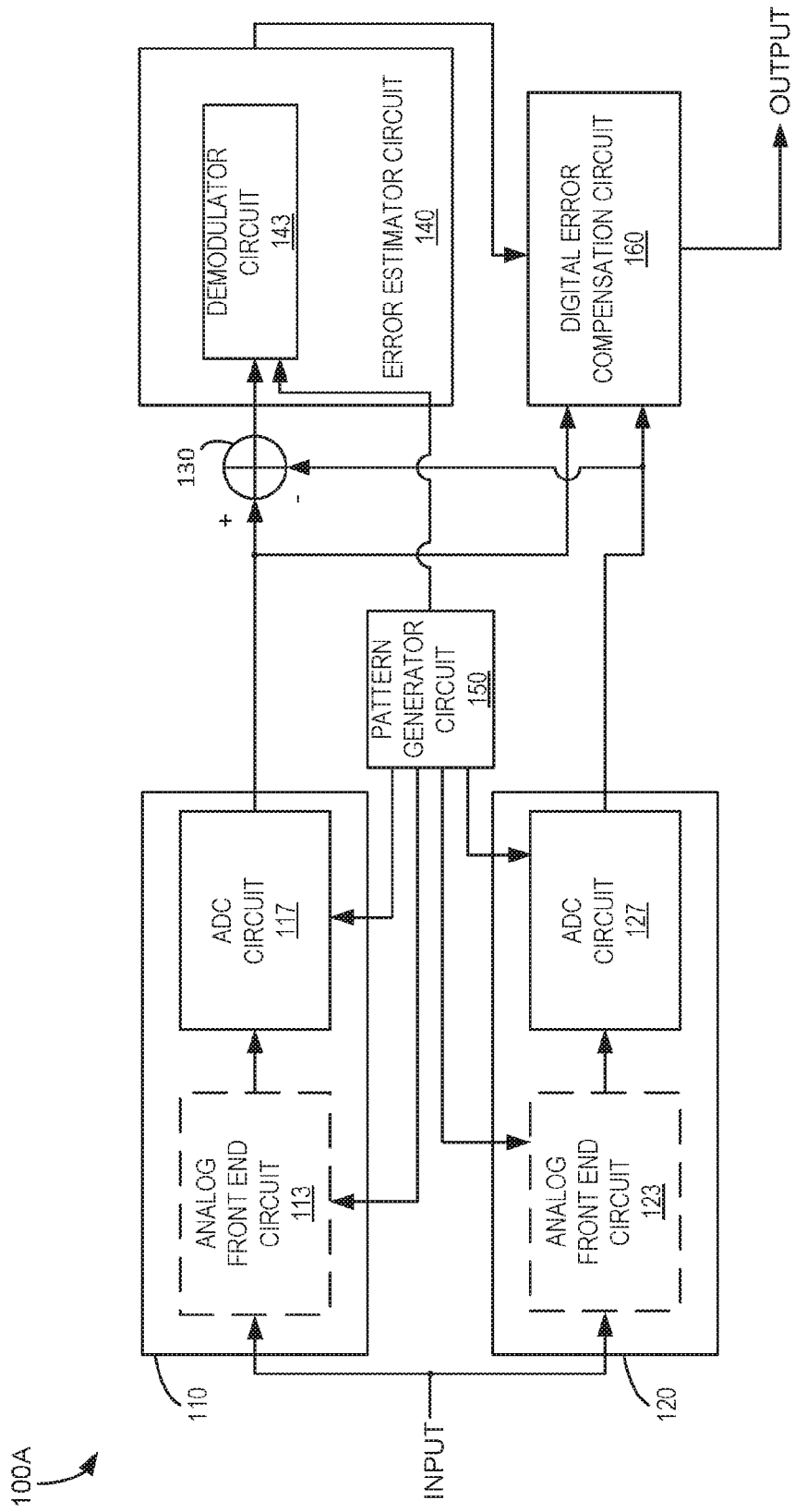
FIG. 1A is a block diagram that illustrates an analog to digital converter (ADC) system for removing errors in a signal chain, according to an embodiment.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

A chopper circuit can include four switches, each of which can have two positions. When the four-switch embodiment of the chopper circuit is in a straight-pass-through configuration, two switches that pass input signals from a pair of input nodes straight through to corresponding output nodes are set in a closed position, while two switches that would cross-couple input signals from a pair of input nodes to opposite output nodes are set in an open position. When the four-switch embodiment of the chopper circuit is in a cross-couple configuration, the two switches that pass input signals from a pair of input nodes straight through to corresponding output nodes are set in an open position, while the two switches that would cross-couple input signals from a pair of input nodes to opposite output nodes are set in a closed position. When there is a voltage offset in the signal being chopped by the chopper circuit, an amplifier that receives the chopped signal can generate ripple. The ripple can rise above and below a desired output signal level by an amount equivalent to the voltage offset, such that the peak-to-peak ripple is equivalent to twice the voltage offset value. In an embodiment, a pair of chopper circuits can be employed on either side of an amplifier, so that the signal can be modulated by the first chopper circuit and demodulated by the second chopper circuit to separate the voltage offset from the signal in the spectrum.

When a chopper circuit switches from a straight-pass-through to a cross-over configuration and vice versa, each switch in the chopper typically generates some amount of charge, which is referred to as charge injection. If all switches of the chopper circuit are perfectly matched to one another, the charges they generate cancel each other out so that there is no net charge injection that affects the signals passed through the chopper. However, if there are mismatches among the switches of the chopper, an unbalanced charge injection can become an input charge seen by a circuit that provides input to the chopper circuit, e.g., an RC network, filter, amplifier, or sensor. As a result, transient overshoots can be generated in the chopped signal at the times when the switches of the chopper circuit change state to chop the input signal. When a rate of sampling of an output of the analog signal chain by an ADC circuit is slow or there are only one or a few samples per chopping cycle, the transient overshoots due to asymmetric charge injection may not be sampled and may therefore not need to be compensated. However, when a sampling rate of the ADC is fast or there are many samples per chopping cycle, the ADC may sample the transient overshoots due to asymmetric charge injection and produce incorrect conversions unless the asymmetric charge injection is compensated.

The error due to asymmetric charge injection is separate from and in addition to the error due to voltage offset, and can be separately measured and separately compensated. While the voltage offset error can be measured at a steady state of the chopped signal after chopping and before being chopped again, the asymmetric charge injection error can be measured as a difference between a value of the chopped signal immediately upon chopping and the chopped signal immediately prior to being chopped again. Both voltage offset error and asymmetric charge injection error can be digitally compensated once their amplitude is known. For example, for asymmetric charge injection, curve fitting can be used. In addition, both voltage offset error and asymmetric charge injection error can be corrected in the analog domain as illustrated herein.

FIG. 1A is a block diagram that illustrates an analog to digital converter (ADC) system 100A for removing errors in a signal chain, according to an embodiment. The ADC system 100A includes a first signal path 110 and a second signal path 120, which separately operate in parallel with each other on a same analog input signal. An input to the first signal path 110 and an input to the second signal path 120 may be coupled together to receive the same analog input signal from an input node INPUT. The first and second signal paths 110, 120 may each include separate first and second analog front end circuits 113, 123 that are respectively cascaded with separate first and second ADC circuits 117, 127 to separately convert the analog input signal into first and second digital signals. In some embodiments, the first and second ADC circuits 117, 127 may not have analog front end circuits 113, 123 disposed between them and the input node INPUT. In those embodiments, the separate first and second ADC circuits 117, 127 may have inputs communicatively coupled with the common input node INPUT. The first signal path 110 may output the first digital signal, while the second signal path 120 may output the second digital signal.

The ADC system 100A may also include a pattern generator circuit 150 to generate a digital modulation pattern for modulating an error in at least one of the first and second signal paths 110, 120. The pattern generator circuit 150 may input a same digital modulation pattern or a different digital modulation pattern to one or more of the first and second analog front end circuits 113, 123, and the first and second ADC circuits 117, 127 for modulating one or more errors. In some embodiments, the modulation of the error in one or more of the first and second analog front end circuits 113, 123, and the first and second ADC circuits 117, 127 may be according to a different digital modulation pattern than another of the first and second analog front end circuits 113, 123, and the first and second ADC circuits 117, 127, so that the different digital modulation patterns are uncorrelated with one another, thereby facilitating each separate error to be individually detected, measured, and compensated. The one or more digital modulation patterns may include a deterministic sequence, a random sequence, a pseudorandom sequence, a maximal length sequence, and/or a noise-shaped sequence. In various embodiments, the random sequence may produce white noise, and the noise-shaped sequence may be implemented using delta-sigma modulation.

The ADC system 100A may also include a difference circuit 130 that generates a difference signal from the first and second digital signals output by the first and second signal paths 110, 120, respectively. The first and second signal paths 110, 120 may include similar components arranged in a similar configuration, so that the difference signal computed as the difference of the first and second digital signals may primarily include only noise and one or more modulated error signals produced by modulation of the errors according to the one or more digital modulation patterns from the pattern generator circuit 150. The errors may include ADC errors, for example, voltage offset mismatches between the ADCs of the first and second signal paths. Modulation of the errors may facilitate separation of other errors from the ADC errors including voltage offset mismatches between the ADCs of the first and second signal paths.

The difference circuit 130 may output the difference signal to an error estimator circuit 140 that includes a demodulator circuit 143. The demodulator circuit 143 may isolate and recover the one or more error signals by demodulating the difference signal by the same one or more digital modulation patterns used to modulate each of the errors corresponding to the one or more error signals in the at least one of the first and second analog front end circuits 113, 123, and the first and second ADC circuits 117, 127. These one or more digital modulation patterns may be provided by the same pattern generator circuit 150 that provides the one or more digital modulation patterns used to modulate the error in the at least one of the first and second analog front end circuits 113, 123, and the first and second ADC circuits 117, 127. The error estimator circuit 140 may generate an error compensation signal for each of the modulated errors in the at least one of the first and second analog front end circuits 113, 123, and the first and second ADC circuits 117, 127. Alternatively, the error estimator circuit 140 may generate an error compensation signal that compensates for the combination of all the modulated errors in the at least one of the first and second analog front end circuits 113, 123, and the first and second ADC circuits 117, 127. The error estimator circuit 140 may use a filter, for example, an integrator, to generate an error compensation signal for each of the demodulated errors. The integrator may have infinite DC loop gain and be a $1^{st}$ order system that is unconditionally stable. The integrator may converge rapidly to generate the error compensation signal because the demodulation is performed on the difference signal that has the digital representation of the input signal effectively removed. In some embodiments, the pattern generator circuit 150 may base the one or more digital modulation patterns on the respective error compensation signal output by the error estimator circuit 140.

The error compensation signal may be used to compensate for the respective error introduced into the first and/or second signal paths 110, 120. In some embodiments, a digital error compensation circuit 160 may compensate for the error in at least one of the first and second digital signals according to the error compensation signal received from the error estimator circuit 140. In some embodiments, the digital error compensation circuit 160 may also sum, filter, and/or average the first and second digital signals prior to and/or after compensating for the error(s). The digital error compensation circuit 160 may then output a compensated digital signal at the OUTPUT node. In the compensated digital signal, evidence of the error(s), e.g., ripple due to chopping a voltage offset error in the first and second signal paths 110, 120, may not be visible.

Figure 1B:
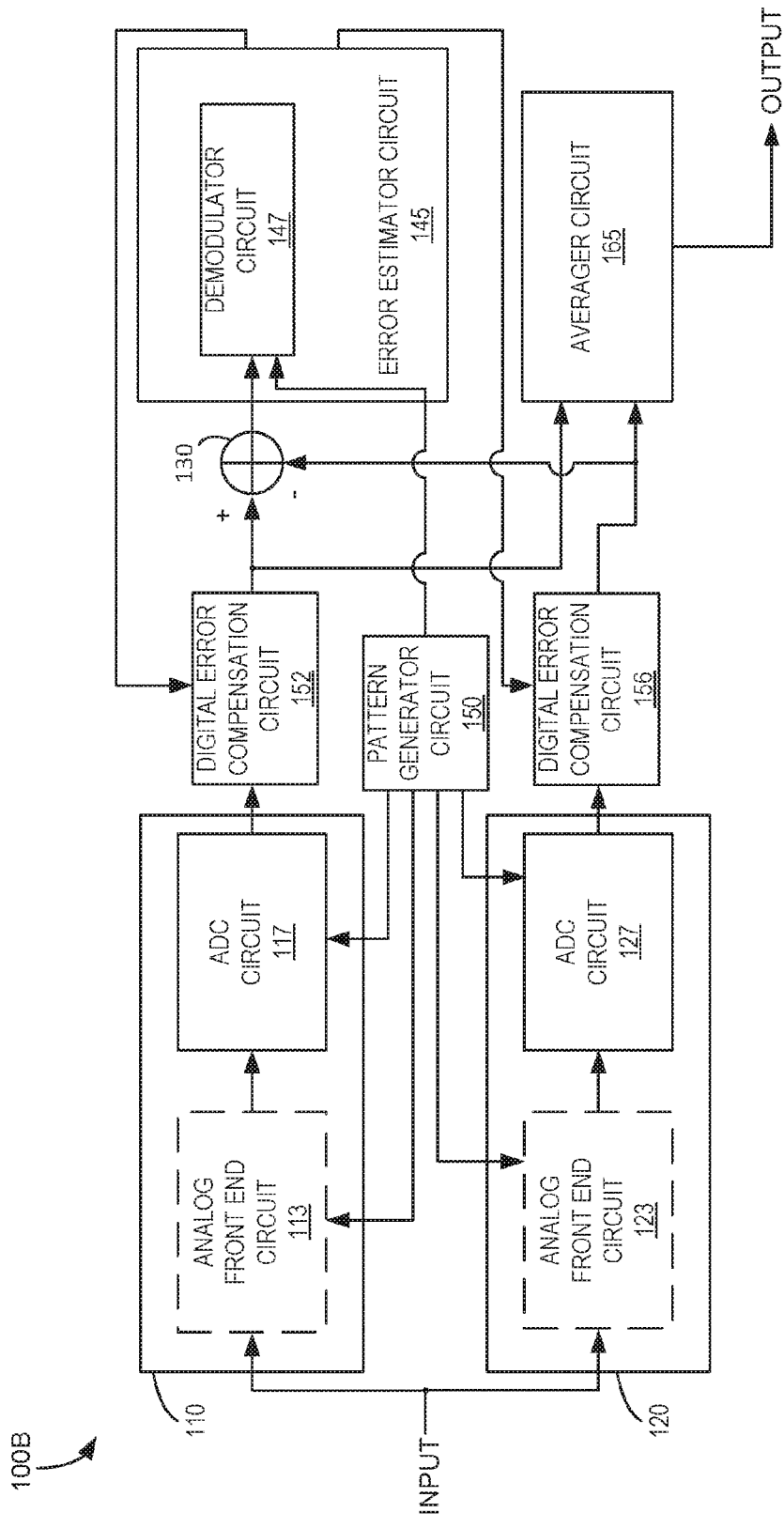
FIG. 1B is a block diagram that illustrates an ADC system for removing errors in a signal chain, according to an embodiment.

FIG. 1B is a block diagram that illustrates an ADC system 100B for removing errors in a signal chain, according to an embodiment. The ADC system 100B is similar to the ADC system 100A illustrated in FIG. 1A, with the following differences. The ADC system 100B includes separate digital error compensation circuits 152, 156 at the output of each of the first and second signal paths 110, 120, respectively, to compensate for the error(s) in the first and second digital signals separately to output compensated first and second digital signals to the difference circuit 130. The digital error compensation circuits 152, 156 may compensate one or more errors in the first and second digital signals according to respective error compensation signals received from an error estimator circuit 145. The error estimator circuit 145 includes a demodulator circuit 147 that demodulates the one or more error signals included in a difference signal received from a difference circuit 130 according to corresponding one or more digital modulation patterns received from the pattern generator circuit 150. Based on the demodulated error signals, the error estimator circuit 145 may estimate the one or more errors and generate corresponding error compensation signals to compensate for the one or more errors, and send the error compensation signals to respective digital error compensation circuits 152, 156 to compensate for the one or more errors.

The difference circuit 130 may generate the difference signal from compensated digital signals output by the digital error compensation circuits 152, 156. The first and second signal paths 110, 120 may include similar components arranged in a similar configuration, so that the difference signal computed by the difference of the compensated digital signals output by the digital error compensation circuits 152, 156 may primarily include only noise and a residue of the one or more error signals modulated according to the digital modulation patterns output by the pattern generator circuit 150 that are not corrected yet by the digital error compensation circuits 152, 156 according to the error compensation signals received from the error estimator circuit 145. The error estimator circuit 145 may iterate on appropriate error compensation signals to send to the digital error compensation circuits 152, 156 using the feedback loop between the digital error compensation circuits 152, 156 and the error estimator circuit 145 until the one or more errors are corrected and no error signals are received by the error estimator circuit 145 as part of the difference signal output by the difference circuit 130.

The compensated digital signals are averaged by the averager circuit 165. In some embodiments, the averager circuit 165 may also filter the compensated first and second digital signals prior to and/or after averaging them together. The averager circuit 165 may then output a compensated digital signal at the OUTPUT node.

Figure 2:
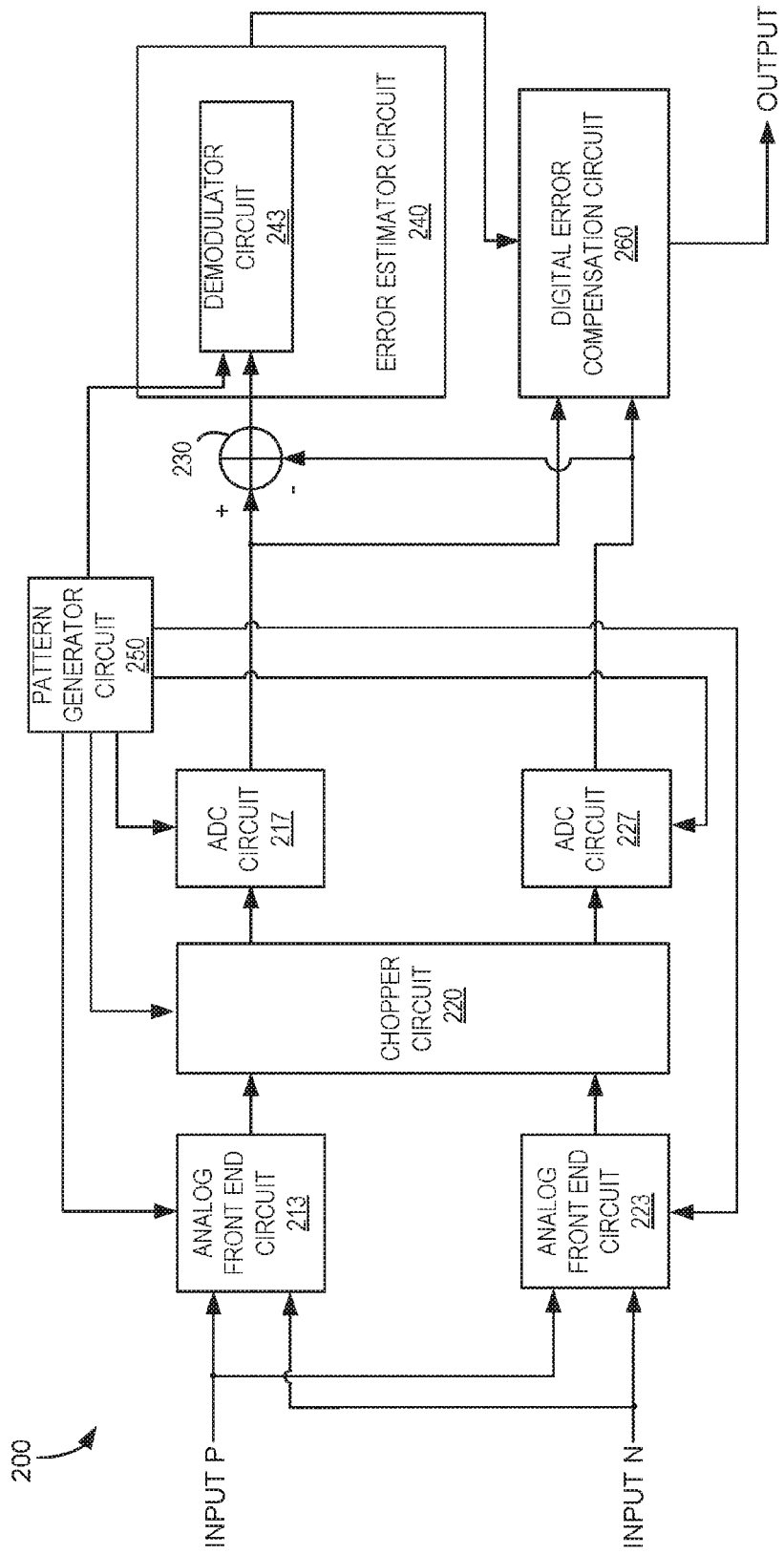
FIG. 2 is a block diagram that illustrates an ADC system for removing errors in a signal chain, according to an embodiment.

FIG. 2 is a block diagram that illustrates an ADC system 200 for removing errors in a signal chain, according to an embodiment. The ADC system 200 is configured to compensate for errors due to the effects of mismatch between separate ADC circuits 217, 227 during error extraction. The ADC system 200 includes separate first and second analog front end circuits 213, 223 that have differential inputs coupled together to receive a same analog input differential signal from the differential input nodes INPUT P and INPUT N. The first and second analog front end circuits 213, 223 are respectively cascaded with separate first and second ADC circuits 217, 227 through a chopper circuit 220 to separately convert the analog input signal into first and second digital signals. When the chopper circuit 220 is in a straight-pass-through configuration, a first signal path is formed by the analog front end circuit 213 through the chopper circuit 220 to the ADC circuit 217, while a second signal path is formed by the analog front end circuit 223 through the chopper circuit 220 to the ADC circuit 227. When the chopper circuit 220 is in a cross-couple configuration, a third signal path is formed by the analog front end circuit 213 through the chopper circuit 220 to the ADC circuit 227, while a fourth signal path is formed by the analog front end circuit 223 through the chopper circuit 220 to the ADC circuit 217. The ADC circuit 217 may output the first digital signal, while the second ADC circuit 227 may output the second digital signal.

The ADC circuit 217 and the ADC circuit 227 may have mismatched offset error, gain error, and linearity error. These mismatch errors between the ADC circuit 217 and the ADC circuit 227 can be captured by difference circuit 230 and fed into error estimator circuit 240. The error estimator circuit 240 may not extract the error from the analog front end circuit 213 and the analog front end circuit 223 perfectly due to these mismatch errors. The chopper circuit 220 can help to modulate these mismatch errors into white noise or noise that can be filtered by a digital filter in the error estimator circuit 240.

The chopper circuit 220 may be controlled to perform chopping according to a digital modulation pattern provided by the pattern generator circuit 250. The digital modulation pattern may include a deterministic sequence, a random sequence, a pseudorandom sequence, a maximal length sequence, and/or a noise-shaped sequence. The chopper circuit 220 may be in a straight-through configuration 50% of the time and in a cross-connect configuration 50% of the time, such that in time average the analog front end circuit 213 and the analog front end circuit 223 equivalently use the same ADC circuit to measure their respective output signals by swapping connections between the respective analog front end circuits 213, 223 and ADC circuits 217, 227. By doing this, difference circuit 230 output will have the modulated mismatch error between the ADC circuit 217 and the ADC circuit 227. The modulated mismatch error may appear as white noise, shaped noise or fixed pattern noise, which can be filtered by the error estimator circuit 240.

The difference circuit 230 generates a difference signal from the first and second digital signals output by the ADC circuits 217, 227, respectively. The difference of the first and second digital signals may primarily include only noise and one or more modulated error signals produced by modulation of the errors by one or more of the analog front end circuits 213, 223, the ADC circuits 217, 227, and the chopper circuit 220, e.g., according to the digital modulation pattern from the pattern generator circuit 250.

The difference circuit 230 may output the difference signal to the error estimator circuit 240 that includes a demodulator circuit 243. The demodulator circuit 243 may isolate and recover the one or more error signals by demodulating the difference signal by the same one or more digital modulation patterns from the pattern generator circuit 250 used to modulate each of the errors corresponding to the one or more error signals in the one or more of the analog front end circuits 213, 223, chopper circuit 220, and ADC circuits 217, 227. The error estimator circuit 240 may generate an error compensation signal for each of the modulated errors in the one or more of the analog front end circuits 213, 223, chopper circuit 220, and ADC circuits 217, 227. The error estimator circuit 240 may generate an error compensation signal that compensates for the combination of all the modulated errors in the one or more of the analog front end circuits 213, 223, chopper circuit 220, and ADC circuits 217, 227. The error estimator circuit 240 may provide the error compensation signal to a digital error compensation circuit 260. The error estimator circuit 240 may use a filter, for example, an integrator, to generate an error compensation signal for each of the demodulated errors. The integrator may have infinite DC loop gain and be a $1^{st}$ order system that is unconditionally stable. The integrator may converge rapidly to generate the error compensation signal because the demodulation is performed on the difference signal that has the digital representation of the input signal effectively removed.

The ADC system 200 may also include a digital error compensation circuit 260 to compensate for errors modulated in one or more of the analog front end circuits 213, 223, chopper circuit 220, and ADC circuits 217, 227, according to one or more digital modulation patterns provided by the pattern generator circuit 250. In some embodiments, the modulation of the error in one or more of the analog front end circuits 213, 223, chopper circuit 220, and ADC circuits 217, 227, may be according to a different digital modulation pattern than another of the analog front end circuits 213, 223, chopper circuit 220, and ADC circuits 217, 227, so that the different digital modulation patterns are uncorrelated with one another, thereby facilitating each separate error to be individually detected, measured, and compensated. The one or more digital modulation patterns may include a deterministic sequence, a random sequence, a pseudorandom sequence, a maximal length sequence, and/or a noise-shaped sequence. In various embodiments, the random sequence may produce white noise, and the noise-shaped sequence may be implemented using delta-sigma modulation.

The error compensation signal may be used to compensate for the respective error introduced into the one or more of the analog front end circuits 213, 223, chopper circuit 220, and ADC circuits 217, 227. In some embodiments, the digital error compensation circuit 260 may compensate for the error in at least one of the first and second digital signals according to the error compensation signal received from the error estimator circuit 240. In some embodiments, the digital error compensation circuit 260 may also sum, filter, and/or average the first and second digital signals prior to and/or after compensating for the error(s). The digital error compensation circuit 260 may then output a compensated digital signal at the OUTPUT node. In the compensated digital signal, evidence of the error(s), e.g., ripple due to chopping a voltage offset error and/or transient overshoots due to asymmetric charge injection, may not be visible.

The difference circuit 230, error estimator circuit 240, demodulator circuit 243, and digital error compensation circuit 260 may be embodiments of the respective difference circuit 130, error estimator circuit 140, demodulator circuit 143, and digital error compensation circuit 160 described with reference to FIG. 1A. In various other embodiments, the difference circuit 230, error estimator circuit 240, demodulator circuit 243, and digital error compensation circuit 260 may be replaced with embodiments of the difference circuit 130, error estimator circuit 145, demodulator circuit 147, digital error compensation circuits 152, 156, and averager circuit 165 described with reference to FIG. 1B.

Figure 3:
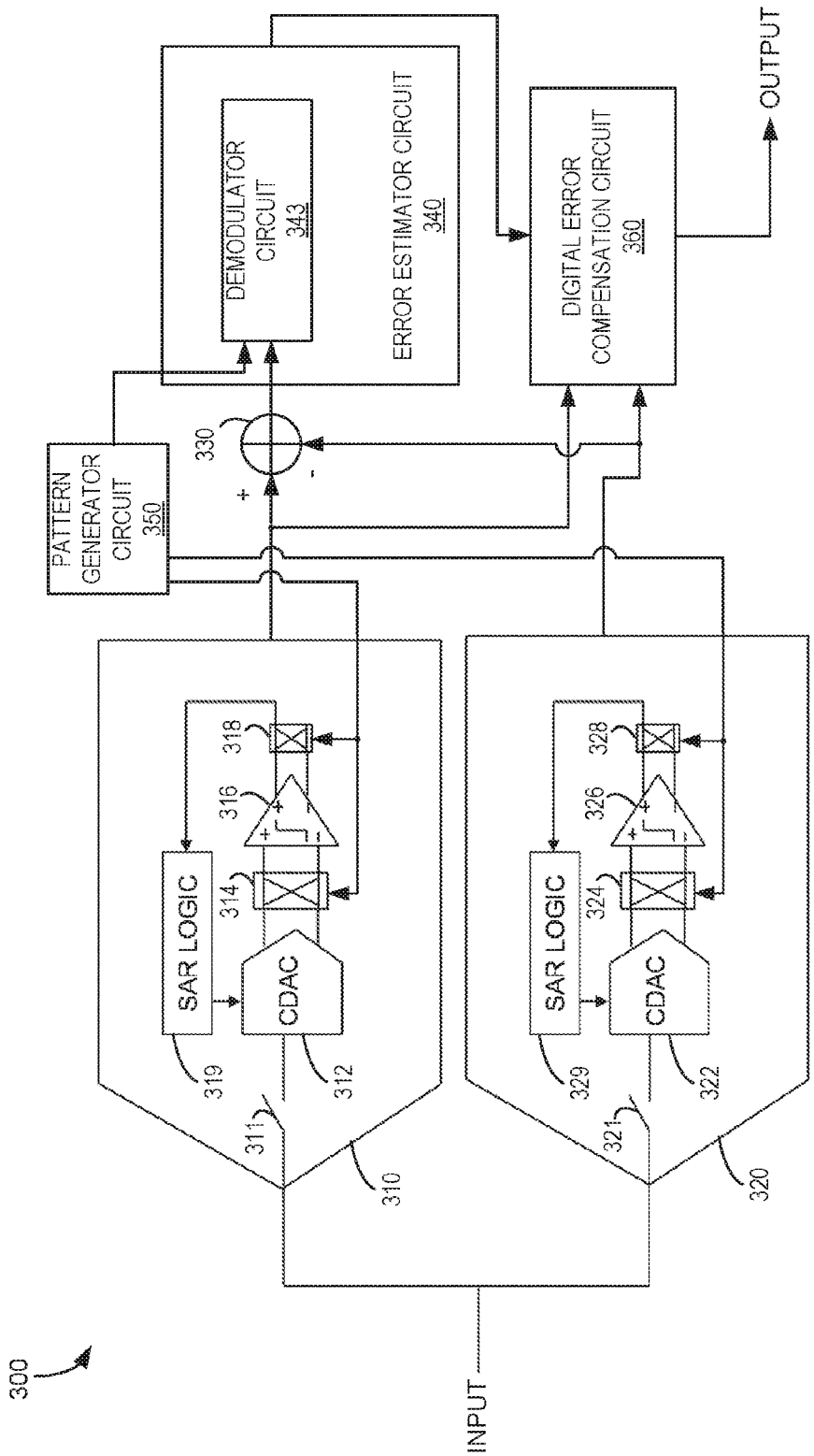
FIG. 3 is a block diagram that illustrates an ADC system for removing errors in a signal chain, according to an embodiment.

FIG. 3 is a block diagram that illustrates an ADC system 300 for removing errors in a signal chain, according to an embodiment. The ADC system 300 includes a first successive-approximation-register (SAR) ADC circuit 310 and a second SAR ADC circuit 320, which separately operate in parallel with each other on a same analog input signal. An input to the first SAR ADC circuit 310 and an input to the second SAR ADC circuit 320 may be coupled together to receive the same analog input signal from an input node INPUT. The first and second SAR ADC circuits 310, 320 may separately convert the analog input signal into first and second digital signals. The first SAR ADC circuit 310 may output the first digital signal, while the second SAR ADC circuit 320 may output the second digital signal.

The ADC system 300 may also include a pattern generator circuit 350 to generate a digital modulation pattern for modulating an error in at least one of the first and second SAR ADC circuits 310, 320. The pattern generator circuit 350 may input a same digital modulation pattern or a different digital modulation pattern to each of the first and second SAR ADC circuits 310, 320 for modulating one or more errors. The digital modulation patterns provided to the first and second SAR ADC circuits 310, 320 may be uncorrelated with one another, thereby facilitating the errors of each of the SAR ADC circuits 310, 320 to be individually detected, measured, and compensated. The one or more digital modulation patterns may include a deterministic sequence, a random sequence, a pseudorandom sequence, a maximal length sequence, and/or a noise-shaped sequence. In various embodiments, the random sequence may produce white noise, and the noise-shaped sequence may be implemented using delta-sigma modulation.

Each SAR ADC 310, 320 may include a respective input switch 311, 321 that samples the analog input signal from the input node INPUT at periodic times. Each SAR ADC 310, 320 may also include a respective feedback loop including a respective capacitive digital-to-analog converter (CDAC) circuit 312, 322, a comparator circuit 316, 326, and a SAR logic circuit 319, 329. Each respective comparator circuit 316, 326 may be preceded by a respective modulating chopper circuit 314, 324 to modulate an error (e.g., a voltage offset error) in the respective SAR ADC 310, 320 according to the digital modulation pattern provided by the respective pattern generator circuit 350. Each respective comparator circuit 316, 326 may be followed by a respective modulating chopper circuit 318, 328 to de-chop the differential signal output from the respective comparator circuit 316, 326. Each SAR ADC 310, 320 may output a respective digital signal.

The ADC system 300 may also include a difference circuit 330 that generates a difference signal from the first and second digital signals output by the first and second SAR ADC circuits 310, 320, respectively. The first and second SAR ADC circuits 310, 320 may include similar components arranged in a similar configuration, so that the difference signal computed as the difference of the first and second digital signals may primarily include only noise and one or more modulated error signals produced by modulation of the errors according to the one or more digital modulation patterns from the pattern generator circuit 350.

The difference circuit 330 may output the difference signal to an error estimator circuit 340 that includes a demodulator circuit 343. The demodulator circuit 343 may isolate and recover the one or more error signals by demodulating the difference signal by the same one or more digital modulation patterns used to modulate each of the errors corresponding to the one or more error signals in at least one of the first and second SAR ADC circuits 310, 320. These one or more digital modulation patterns may be provided by the same pattern generator circuit 350 that provides the one or more digital modulation patterns used to modulate the error in at least one of the first and second SAR ADC circuits 310, 320. The error estimator circuit 340 may generate an error compensation signal for each of the modulated errors in at least one of the first and second SAR ADC circuits 310, 320. The error estimator circuit 340 may also generate an error compensation signal that compensates for the combination of all the modulated errors in the at least one of the first and second SAR ADC circuits 310, 320. The error estimator circuit 340 may use a filter, for example, an integrator, to generate an error compensation signal for each of the demodulated errors. The integrator may have infinite DC loop gain and be a $1^{st}$ order system that is unconditionally stable. The integrator may converge rapidly to generate the error compensation signal because the demodulation is performed on the difference signal that has the digital representation of the input signal effectively removed.

The error compensation signal may be used to compensate for the respective error introduced into the first and second SAR ADC circuits 310, 320. In some embodiments, a digital error compensation circuit 360 may compensate for the error in at least one of the first and second digital signals according to the error compensation signal received from the error estimator circuit 340. In some embodiments, the digital error compensation circuit 360 may also sum, filter, and/or average the first and second digital signals prior to and/or after compensating for the error(s). The digital error compensation circuit 360 may then output a compensated digital signal at the OUTPUT node. In the compensated digital signal, evidence of the error(s), e.g., ripple due to chopping a voltage offset error in the first and second SAR ADC circuits 310, 320, may not be visible.

The difference circuit 330, error estimator circuit 340, demodulator circuit 343, and digital error compensation circuit 360 may be embodiments of the respective difference circuit 130, error estimator circuit 140, demodulator circuit 143, and digital error compensation circuit 160 described with reference to FIG. 1A. In various other embodiments, the difference circuit 330, error estimator circuit 340, demodulator circuit 343, and digital error compensation circuit 360 may be replaced with embodiments of the difference circuit 130, error estimator circuit 145, demodulator circuit 147, digital error compensation circuits 152, 156, and averager circuit 165 described with reference to FIG. 1B.

Figure 4:
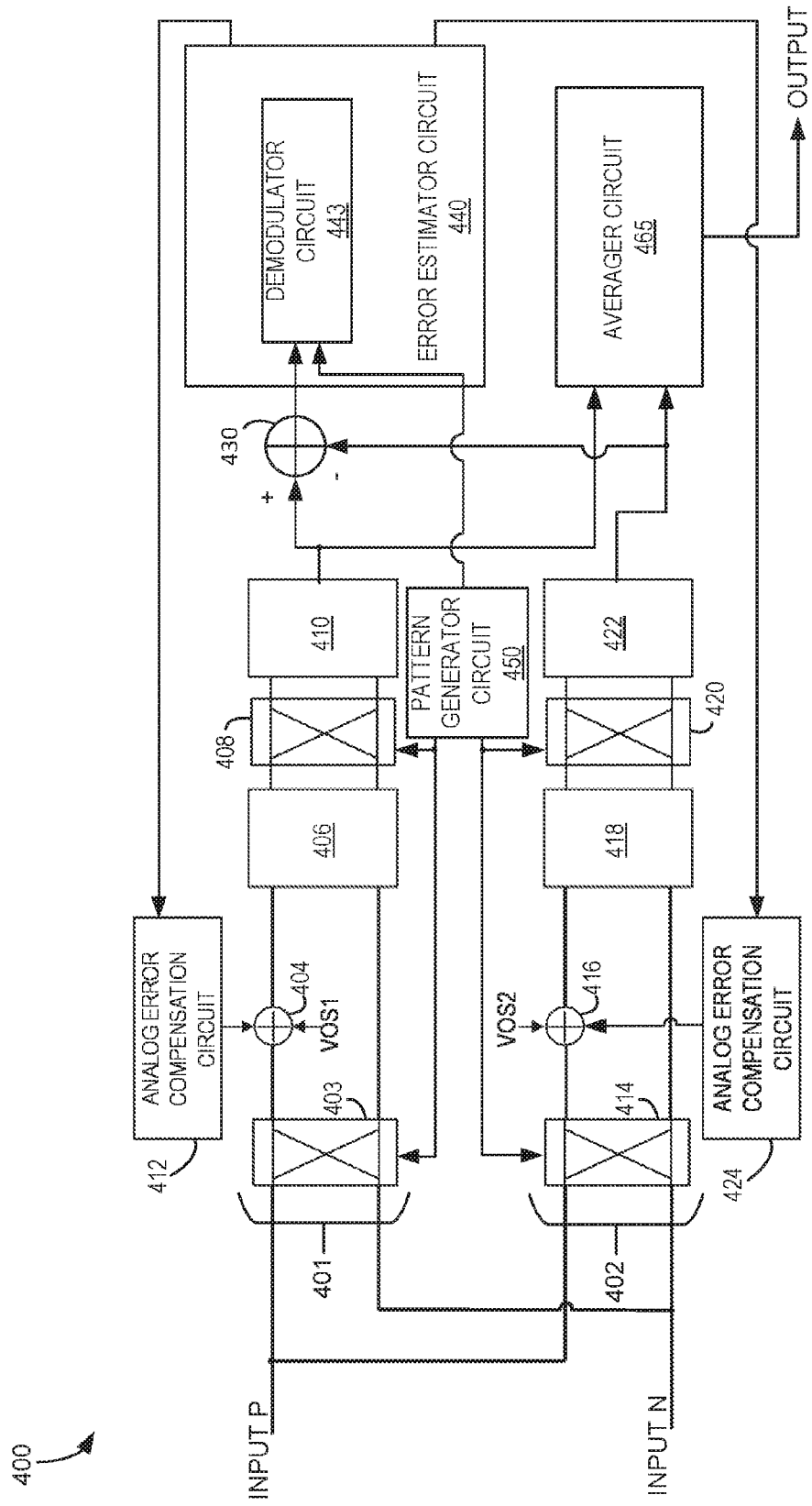
FIG. 4 is a block diagram that illustrates an ADC system for removing errors in a signal chain, according to an embodiment.

FIG. 4 is a block diagram that illustrates an ADC system 400 for removing errors in a signal chain, according to an embodiment. The ADC system 400 includes a first signal path 401 and a second signal path 402 which separately operate in parallel with one another on a same analog input signal. The analog input signal is a differential analog signal having a positive polarity input INPUT P and a negative polarity input INPUT N. An input to the first signal path 401 and an input to the second signal path 402 may be coupled together to receive the same analog input signal. The first and second signal paths 401, 402 each include separate first signal chain portions 406, 418, and second signal chain portions 410, 422. The first signal chain portions 406, 418 and second signal chain portions 410, 422 may include any combination of analog front end circuits, which may include separate amplifiers, and separate ADC circuits to convert the analog input signal into first and second digital signals output from the respective second signal chain portions 410, 422. The first signal path 401 may output the first digital signal from the second signal chain portion 410, while the second signal path 402 may output the second digital signal from the second signal chain portion 422.

In the first and second signal paths 401, 402, voltage offset errors are represented as respective voltage offset error signals VOS1, VOS2 input to respective summer circuits 404, 416 to add to the respective input signal prior to entering the respective first signal chain portion 406, 418. The voltage offset errors may be equivalent to amplifier input referred offset voltages. To modulate the respective voltage offset error signals VOS1, VOS2 so that they may be identified and compensated, respective first modulating chopper circuits 403, 414 are disposed in the respective first and second signal paths 401, 402 upstream of the respective summers 404, 416. Respective second modulating chopper circuits 408, 420 are disposed in the respective first and second signal paths 401, 402 downstream of the respective first signal chain portions 406, 418. The signal chain in each of the first and second signal paths 401, 402 is broken into respective first signal chain portions 406, 418 and second signal chain portions 410, 422 separated by the respective second modulating chopper circuits 408, 420 to illustrate that the second modulating chopper circuits 408, 420 may be included in any of a variety of locations within the respective first and second signal paths 401, 402 following the source of the voltage offset errors, e.g., following the amplifier inputs for which the voltage offset errors are equivalent to amplifier input referred offsets.

The ADC system 400 may also include a pattern generator circuit 450 to modulate an error in at least one of the first and second signal paths 401, 402 according to a digital modulation pattern. The pair of modulating chopper circuits 403, 408 in the first signal path 401 may chop the differential input signal INPUT P, INPUT N according to a same digital modulation pattern provided by the pattern generator circuit 450, while the pair of modulating chopper circuits 414, 418 in the second signal path 402 may also chop the differential input signal INPUT P, INPUT N according to a same digital modulation pattern provided by a pattern generator circuit 450. The digital modulation pattern provided to the pair of modulating chopper circuits 403, 408 may be the same as or different from the digital modulation pattern provided to the pair of modulating chopper circuits 414, 418. The digital modulation pattern provided to the pair of modulating chopper circuits 403, 408 may be uncorrelated with the digital modulation pattern provided to the pair of modulating chopper circuits 414, 418 to decorrelate the modulated voltage offset error signal VOS1 from the modulated voltage offset error signal VOS2.

The one or more digital modulation patterns provided by the pattern generator circuit 450 may include a random sequence, a deterministic sequence, a pseudorandom sequence, a maximal length sequence, and/or a noise-shaped sequence. In various embodiments, the random sequence may produce white noise, and the noise-shaped sequence may be implemented using delta-sigma modulation.

The ADC system 400 may also include a difference circuit 430 that generates a difference signal from the first and second digital signals output by the first and second signal paths 401, 402, respectively. The first and second signal paths 401, 402 may include similar components arranged in a similar configuration, so that the difference signal computed by the difference of the first and second digital signals may primarily include only noise and the one or more error signals VOS1, VOS2 modulated by modulating chopper circuits 403, 408, 414, 418.

The difference circuit 430 may output the difference signal to the error estimator circuit 440. The error estimator circuit 440 may include a demodulator circuit that isolates and recovers the one or more error signals VOS1, VOS2 and generates an error compensation signal by demodulating the difference signal by the same one or more digital modulation patterns used to modulate the error in at least one of the first and second signal paths 401, 402. These one or more digital modulation patterns may be provided by the same pattern generator circuit 450 that provides the one or more digital modulation patterns used to modulate the error in at least one of the first and second signal paths 401, 402.

The error compensation signal generated by the error estimator circuit 440 may be used to compensate for the error introduced into the first and/or second signal paths 401, 402 in the analog domain. In an embodiment, analog error compensation circuits 412, 424 may each receive a respective error compensation signal from the error estimator circuit 440 and accordingly compensate for the respective voltage offset error signals VOS1, VOS2 in the respective first and signal paths 401, 402 by adding respective error cancelation signals at positions where the respective voltage offset error signals VOS1, VOS2 are introduced in the respective first and second signal paths 401, 402. This is illustrated in FIG. 4 by adding outputs of the analog error compensation circuits 412, 424 to the differential input signal in the respective first and second signal paths 401, 402 at the same respective summer circuits 404, 416 at which the respective voltage offset error signals VOS1, VOS2 are added to the differential input signal prior to entering the respective first signal chain portions 406, 418. The error cancelation signals output by the analog error compensation circuits 412, 424 may be equivalent to an opposite of the respective voltage offset error signals VOS1, VOS2 to effectively cancel out the respective voltage offset error signals VOS1, VOS2 when summed with the respective voltage offset error signals VOS1, VOS2.

In an embodiment, the analog error compensation circuits 412 and 424 may each include an amplifier circuit that features a constant current source that provides current to a pair of switched current paths to a common ground or low voltage circuit node. One of the pair of switched current paths may include a first PMOS transistor having a source coupled with an output of the constant current source, a gate coupled with the positive polarity signal INPUT P of the differential input signal, and a drain coupled with an input side of a first adjustable current source. The other of the pair of switched current paths may include a second PMOS transistor having a source coupled with an output of the constant current source, a gate coupled with the negative polarity signal INPUT N of the differential input signal, and a drain coupled with an input side of a second adjustable current source. Output sides of the first and second adjustable current sources may be coupled together at a low voltage node or ground node of the analog error compensation circuit. Current flow of the first and second adjustable current sources may be adjusted according to the error compensation signal input to the respective analog error compensation circuit 412, 424 to compensate for the respective voltage offset error signal VOS1, VOS2. The current flow may be tuned until the error compensation signal output from the error estimator circuit 440 to the respective analog error compensation circuit 412, 424 reaches a value of zero.

In another embodiment, the analog error compensation circuits 412 and 424 may include a digital to analog converter (DAC), for example, a current DAC.

The first and second digital signals output by the first and second signal paths 401, 402 may be averaged by an averager circuit 465 prior to being output as a compensated digital signal in which ripple due to chopping in the first and second signal paths 401, 402 is not visible. In some embodiments, the averager circuit 465 may also include a filter, for example, a low pass filter that outputs a low-pass filtered representation of the average of the first and second digital signals.

Compensating the voltage offset errors in the analog domain at the source of the errors has some advantages over compensating the voltage offset errors in the digital domain. When the signal chain has limited bandwidth, the voltage offset error can have a settling tail at the output of the signal chain. This effect can be more complicated to correct in the digital domain. One approach would be to do digital curve fitting based on the signal chain bandwidth. However, compensating for the error in the analog domain would not be as complicated, because once the error is tuned to zero, no voltage offset error would propagate through the signal source, and chopping the signal would not create ripple.

Figure 5:
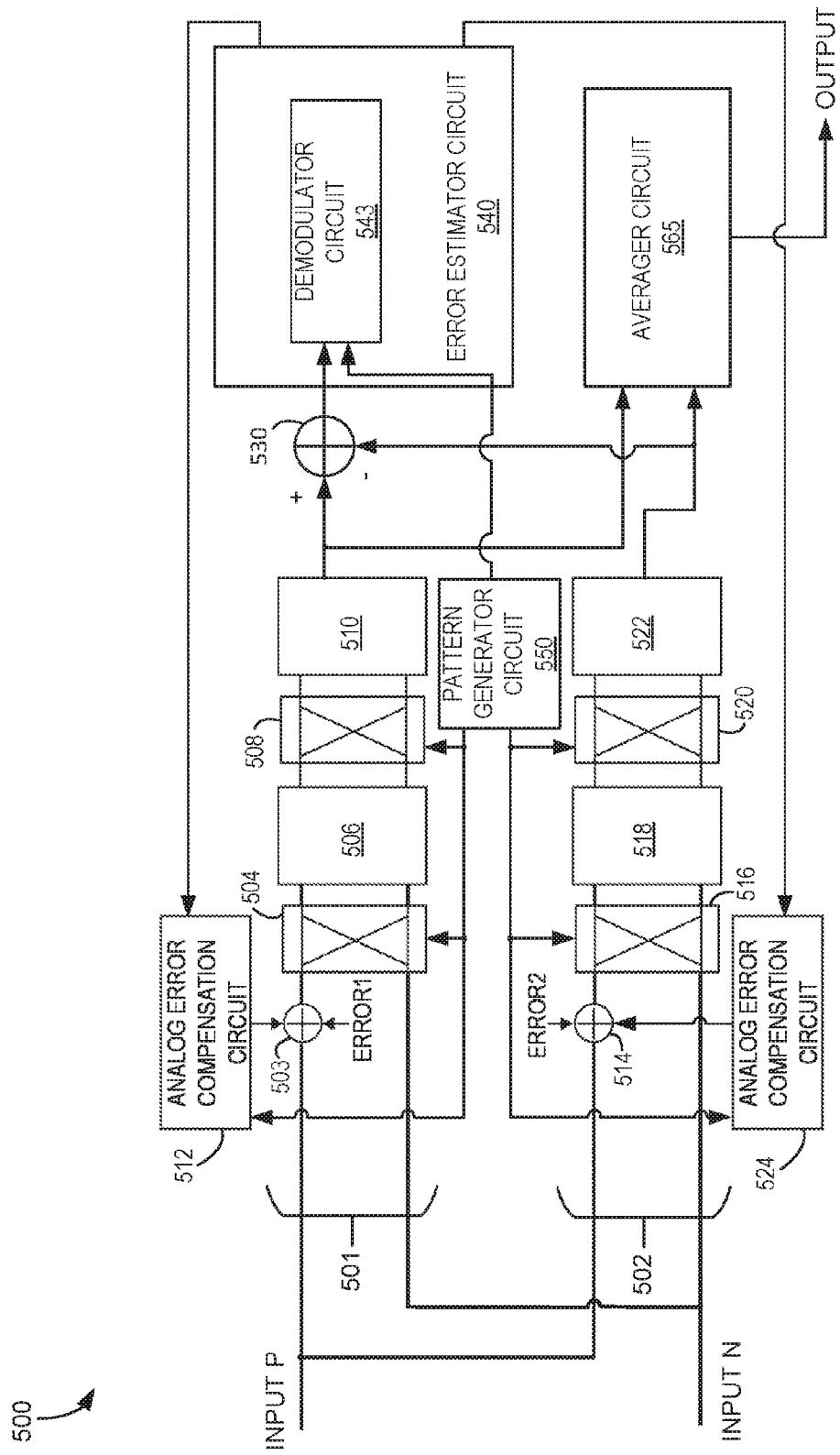
FIG. 5 is a block diagram that illustrates an ADC system for removing errors in a signal chain, according to an embodiment.

FIG. 5 is a block diagram that illustrates an ADC system 500 for removing errors in a signal chain, according to an embodiment. The ADC system 500 includes a first signal path 501 and a second signal path 502 which separately operate in parallel with one another on a same analog input signal. The analog input signal is a differential analog signal having a positive polarity input INPUT P and a negative polarity input INPUT N. An input to the first signal path 501 and an input to the second signal path 502 may be coupled together to receive the same analog input signal. The first and second signal paths 501, 502 each include separate first signal chain portions 506, 518, and second signal chain portions 510, 522. The first signal chain portions 506, 518 may include any combination of analog front end circuits, which may include separate amplifiers. The second signal chain portions 510, 522 may include any combination of circuits that include separate ADC circuits to convert the analog input signal into first and second digital signals output from the respective second signal chain portions 510, 522. The first signal path 501 may output the first digital signal from the second signal chain portion 510, while the second signal path 502 may output the second digital signal from the second signal chain portion 522.

In the first and second signal paths 501, 502, respective asymmetric charge injection errors are represented as asymmetric charge injection error signals ERROR1, ERROR2 input to respective summer circuits 503, 514 to sum with the respective input signal prior to entering respective modulating chopper circuits 504, 516. The asymmetric charge injection errors represented by asymmetric charge injection error signals ERROR1, ERROR2 may occur at the instance in time when the first modulating chopper circuits 504, 516 disposed in the respective first and second signal paths 501, 502 downstream of the respective summer circuits 503, 514 and upstream of the respective first signal chain portions 506, 518 change state from a straight-through connection to a cross connection and vice-versa. At the instance in time when the chopper circuits 504, 516 change state, the switches of the chopper circuits 504, 516 cause a charge injection into the respective first and second signal paths 501, 502 where indicated by the addition of the asymmetric charge injection error signals ERROR1, ERROR2 to respective summer circuits 503, 514. As such, the asymmetric charge injection error signals ERROR1, ERROR2 may be collateral results of the chopping performed by the chopper circuits 504, 516.

While the charge injection occurs at an instance in time, a signal disturbance represented by the asymmetric charge injection error signals ERROR1, ERROR2 occurs over a period of time. The signal disturbance may appear as a voltage spike at the moment the chopper circuits 504, 516 change state followed by an asymptotic settling of the voltage to a steady-state value. The length of the settling time required to reach the steady-state value may depend upon various circuit elements and configuration factors, for example, characteristics of the circuit elements, sensors, and system configuration.

Second modulating chopper circuits 508, 520 are disposed in the respective first and second signal paths 501, 502 downstream of the respective first signal chain portions 506, 518. The signal chain in each of the first and second signal paths 501, 502 is broken into respective first signal chain portions 506, 518 and second signal chain portions 510, 522 separated by the respective second modulating chopper circuits 508, 520 to illustrate that the second modulating chopper circuits 508, 520 may be included in any of a variety of locations within the respective first and second signal paths 501, 502 following the source of the asymmetric charge injection errors.

The ADC system 500 may also include a pattern generator circuit 550 to modulate an error in at least one of the first and second signal paths 501, 502 according to a digital modulation pattern. The pair of modulating chopper circuits 504, 508 in the first signal path 501 may chop the differential input signal INPUT P, INPUT N according to a same digital modulation pattern provided by the pattern generator circuit 550, while the pair of modulating chopper circuits 516, 520 in the second signal path 502 may also chop the differential input signal INPUT P, INPUT N according to a same digital modulation pattern provided by the pattern generator circuit 550. The digital modulation pattern provided to the pair of modulating chopper circuits 504, 508 may be the same as or different from the digital modulation pattern provided to the pair of modulating chopper circuits 516, 520. The digital modulation pattern provided to the pair of modulating chopper circuits 504, 508 may be uncorrelated with the digital modulation pattern provided to the pair of modulating chopper circuits 516, 520 to decorrelate modulated errors in the first signal path 501 from modulated errors in the second signal path 502.

The one or more digital modulation patterns provided by the pattern generator circuit 550 may include a random sequence, a deterministic sequence, a pseudorandom sequence, a maximal length sequence, and/or a noise-shaped sequence. In various embodiments, the random sequence may produce white noise, and the noise-shaped sequence may be implemented using delta-sigma modulation.

The ADC system 500 may also include a difference circuit 530 that generates a difference signal from the first and second digital signals output by the first and second signal paths 501, 502, respectively. The first and second signal paths 501, 502 may include similar components arranged in a similar configuration, so that the difference signal computed by the difference of the first and second digital signals may primarily include only noise, the one or more asymmetric charge injection error signals ERROR1, ERROR2, and any other errors modulated by modulating chopper circuits 504, 508, 516, 520.

The difference circuit 530 may output the difference signal to the error estimator circuit 540. The error estimator circuit 540 may include a demodulator circuit 543 that isolates and recovers one or more error signals ERROR1, ERROR2 and may generate an error compensation signal by demodulating the difference signal by the same one or more digital modulation patterns used to modulate the error in at least one of the first and second signal paths 501, 502. These one or more digital modulation patterns may be provided by the same pattern generator circuit 550 that provides the one or more digital modulation patterns used to modulate the error in at least one of the first and second signal paths 501, 502.

The error compensation signal generated by the error estimator circuit 540 may be used to compensate for the error introduced into the first and/or second signal paths 501, 502 in the analog domain. In an embodiment, analog error compensation circuits 512, 524 may each receive a respective error compensation signal from the error estimator circuit 540 and accordingly compensate for the respective asymmetric charge injection error signals ERROR1, ERROR2 in the respective first and signal paths 501, 502 by adding respective error cancelation signals at positions where the respective asymmetric charge injection error signals ERROR1, ERROR2 are introduced in the respective first and second signal paths 501, 502. This is illustrated in FIG. 5 by adding outputs of the analog error compensation circuits 512, 524 to the differential input signal in the respective first and second signal paths 501, 502 at the same respective summer circuits 503, 514 at which the respective asymmetric charge injection error signals ERROR1, ERROR2 are added to the differential input signal prior to entering the respective modulating chopper circuits 504, 516. The error cancelation signals output by the analog error compensation circuits 512, 524 may be equivalent to an opposite of the respective asymmetric charge injection error signals ERROR1, ERROR2 to effectively cancel out the respective asymmetric charge injection error signals ERROR1, ERROR2 when summed with the respective asymmetric charge injection error signals ERROR1, ERROR2.

The values and characteristics of the asymmetric charge injection error signals ERROR1, ERROR2 may be different when the chopper circuits 504, 516 change state from a straight-through connection configuration to a cross connection configuration than when the chopper circuits 504, 516 change state from a cross connection configuration to a straight-through connection configuration. This can be compensated for by using information from the pattern generator circuit 550 about the one or more digital modulation patterns provided to the chopper circuits 504, 516 so that the error cancelation signals output by the analog error compensation circuits 512, 524 are output to the respective summer circuits 503, 514 with the correct values at the correct times. The error compensation may therefore be performed according to the timing and type of chopper status transition, not merely the chopper status.

In an embodiment, the analog error compensation circuits 512, 524 may include a DAC, such as a capacitor DAC. The DAC included in the respective analog error compensation circuits 512, 524 may inject some charge into the signal at the respective summer circuit 503, 514 to compensate for the asymmetric charge injection error according to digital modulation pattern provided by the pattern generator circuit 550. The amount of the charge injected may be controlled by the error compensation signal provided by the error estimator circuit 540 to the respective analog compensation circuits 512, 524. Once the analog error compensation circuits 512, 524 converge on a correct amount of charge injection to correct the asymmetric charge injection errors, the asymmetric charge injection errors may no longer be seen at the output of the ADC circuits in the first and second signal paths 501, 502.

The first and second digital signals output by the first and second signal paths 501, 502 may be averaged by an averager circuit 565 prior to being output as a compensated digital signal in which transient overshoots due to chopping in the first and second signal paths 501, 502 are not visible. In some embodiments, the averager circuit 565 may also include a filter, for example, a low pass filter that outputs a low-pass filtered representation of the average of the first and second digital signals.

In various embodiments, the embodiments of FIGS. 4 and 5 may be combined to correct for both the voltage offset errors VOS1, VOS2 and the asymmetric charge injection errors ERROR1, ERROR2. In such embodiments, analog compensation circuits 412, 424 may correct for the voltage offset errors at the source of the voltage offset errors while analog compensation circuits 512, 524 may correct for the asymmetric charge injection errors at the source of the asymmetric charge injection errors. The combination of the analog compensation circuits 412, 424 and the analog compensation circuits 512, 524 may compensate for both modulated errors and additional errors resulting from the modulation of the errors.

Figure 6:
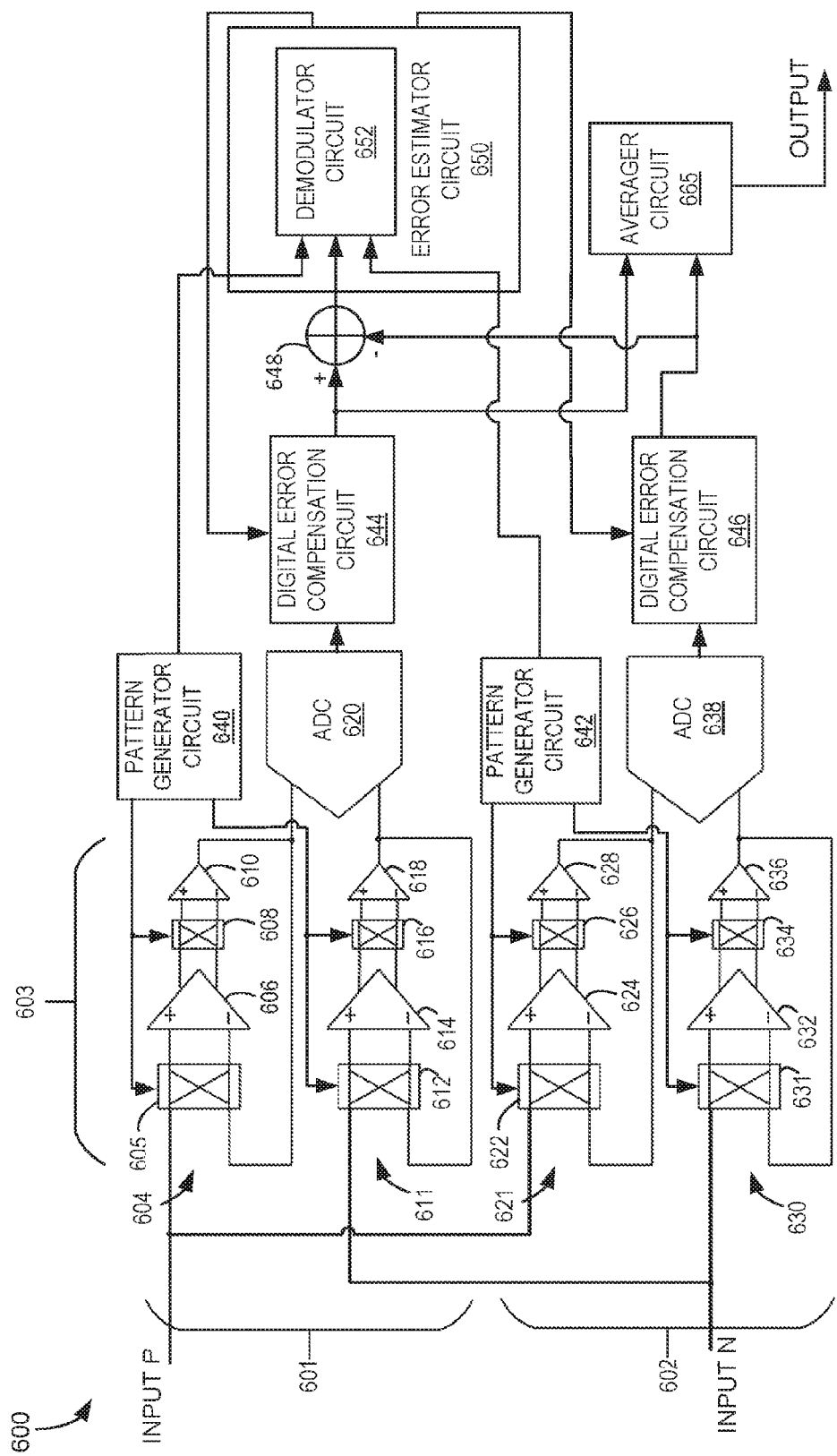
FIG. 6 is a block diagram that illustrates an ADC system for removing errors in a signal chain, according to an embodiment.

FIG. 6 is a block diagram that illustrates an ADC system 600 for removing errors in a signal chain, according to an embodiment. The ADC system 600 includes a first signal path 601 and a second signal path 602 which separately operate in parallel with one another on a same analog input signal. The analog input signal may be a differential analog signal having a positive polarity input INPUT P and a negative polarity input INPUT N. An input to the first signal path 601 and an input to the second signal path 602 may be coupled together to receive the same analog input signal. The first and second signal paths 601, 602 may each include separate respective analog front end circuits 604, 611, 621, 630 for each polarity of the differential pair that are respectively cascaded with separate first and second ADC circuits 620, 638 to separately convert the analog input signal into first and second digital signals. The first signal path 601 may output the first digital signal, while the second signal path 602 may output the second digital signal.

Each of the illustrated analog front end circuits 604, 611, 621, 630 may be an ADC buffer amplifier. Each of the front end circuits 604, 611, 621, 630 disposed upstream of a respective ADC circuit 620, 638 may include a pair of respective amplifier circuits 606, 610; 614, 618; 624, 628; 632, 636. Each first amplifier circuit 606, 614, 624, 632 of a respective pair of amplifier circuits 606, 610; 614, 618; 624, 628; 632, 636 may have a respective modulating chopper circuit 605, 612, 622, 631 at its differential input to chop the input differential signal according to a chopping pattern determined by a respective pattern generator circuit 640, 642. Each second amplifier circuit 610, 618, 628, 636 of a respective pair of amplifier circuits 606, 610; 614, 618; 624, 628; 632, 636 may have a respective modulating chopper circuit 608, 616, 626, 634 at its differential input to de-chop the output of the respective first amplifier circuit 606, 614, 624, 632 according to the same chopping pattern determined by the respective pattern generator circuit 640, 642 used by the respective modulating chopper circuit 608, 616, 626, 634. An output of each of the second amplifier circuits 610, 618, 628, 636 may be coupled to one of two differential inputs of the respective ADC circuit 620, 638 with which it is cascaded.

The illustrated front end circuits 604, 611, 621, 630 together form a single front end stage 603. In various embodiments, a plurality of front end stages 603 may be cascaded together. In these embodiments, each of the plurality of front end stages 603 may include a modulating chopper circuit that uses a different chopping pattern provided by the respective pattern generator circuit 640, 642 than the other stages 603 in order to decorrelate the errors of each stage 603 from the other stages 603. In various embodiments, each of the plurality of front end stages 603 may include different front end signal conditioning circuits and may use different amplifier configurations.

The modulation of the chopping frequency of the modulating chopper circuits 605, 612, 622, 631 may have the effect of modulating one or more error signals by the modulating chopping circuits 605, 612, 622, 631. In various embodiments, one or more of the modulating chopper circuits 605, 612, 622, 631 may chop the differential input signal according to a different digital modulation pattern than another of the modulating chopper circuits 605, 612, 622, 631. The different digital modulation patterns provided by respective pattern generator circuits 640, 642 may be uncorrelated with each other. The one or more digital modulation patterns may include a random sequence, a deterministic sequence, a pseudorandom sequence, a maximal length sequence, and/or a noise-shaped sequence. In various embodiments, the random sequence may produce white noise, and the noise-shaped sequence may be implemented using delta-sigma modulation.

The ADC system 600 may also include digital error compensation circuits 644, 646 that compensate for errors in the respective first and second digital signals output by the respective first and second signal paths 601, 602, according to respective error compensation signals received from an error estimator circuit 650. The error estimator circuit 650 includes a demodulator circuit 652 that demodulates the one or more error signals included in a difference signal received from a difference circuit 648 according to corresponding one or more digital modulation patterns received from the pattern generator circuits 640, 642. Based on the demodulated error signals, the error estimator circuit 650 may estimate the one or more errors and generate corresponding one or more error compensation signals to compensate for the one or more errors.

The difference circuit 648 may generate the difference signal from compensated digital signals output by the digital error compensation circuits 644, 646. The first and second signal paths 601, 602 may include similar components arranged in a similar configuration, so that the difference signal computed by the difference of the digital signals output by the digital error compensation circuits 644, 646 may primarily include only noise and a residue of the one or more error signals modulated according to the digital modulation patterns output by the pattern generator circuits 640, 642 that is not corrected yet by the digital error compensation circuits 644, 646 according to the error compensation signals received from the error estimator circuit 650. The error estimator circuit 650 may iterate on appropriate error compensation signals to send to the digital error compensation circuits 644, 646 using the feedback loop between the digital error compensation circuits 644, 646 and the error estimator circuit 650 until the one or more errors are corrected and no error signals are received by the error estimator circuit 650 as part of the difference signal output by the difference circuit 648.

The error estimator circuit 650, demodulator circuit 652, digital error compensation circuits 644, 646, difference circuit 648, and averager circuit 665 may be embodiments of the respective error estimator circuit 145, demodulator circuit 147, digital error compensation circuits 152, 156, difference circuit 130, and averager circuit 165 described with reference to FIG. 1B. In various other embodiments, the error estimator circuit 650, demodulator circuit 652, digital error compensation circuits 644, 646, difference circuit 648, and averager circuit 665 may be replaced with embodiments of the difference circuit 130, error estimator circuit 140, demodulator circuit 143, and digital error compensation circuit 160 described with reference to FIG. 1A.

Figure 7:
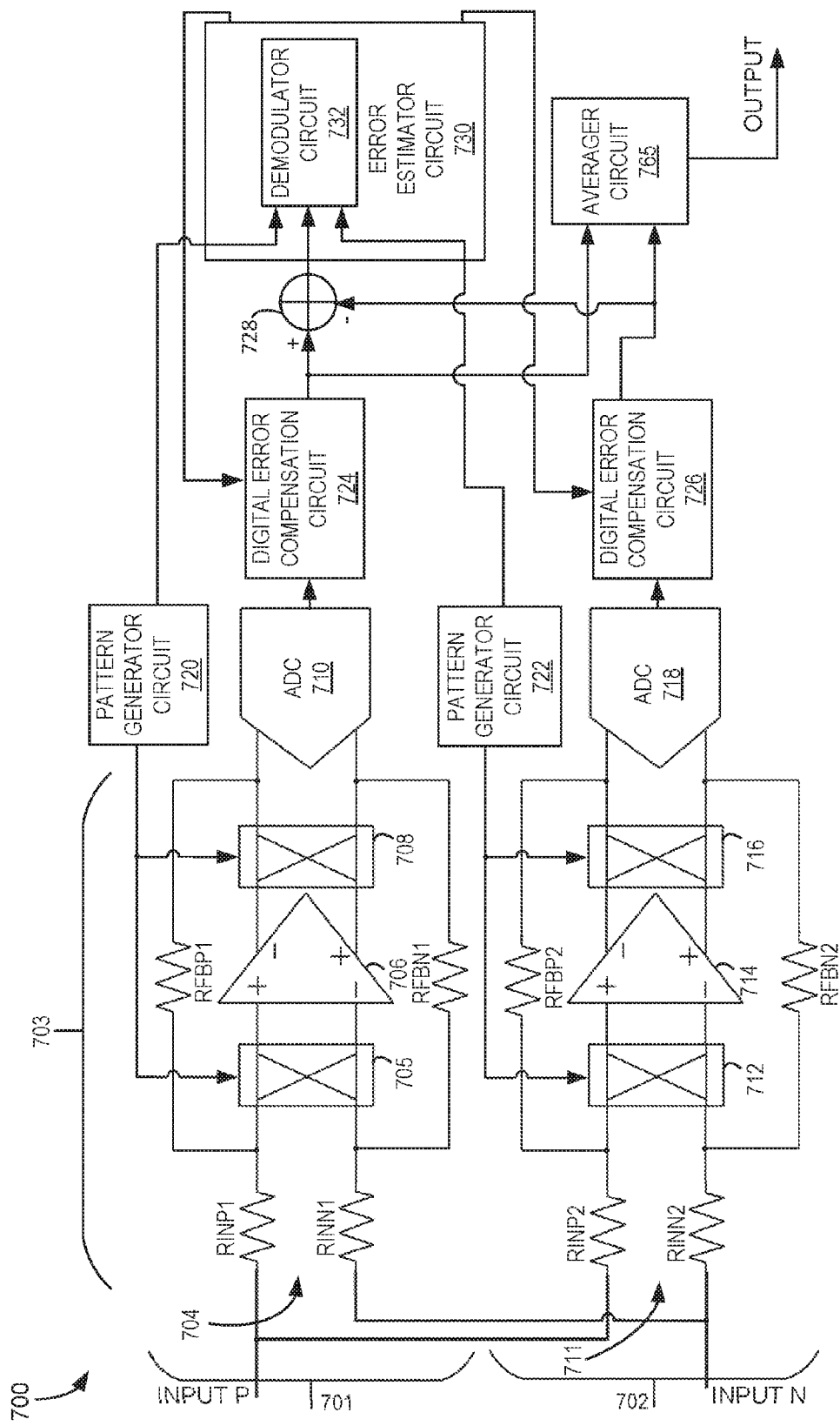
FIG. 7 is a block diagram that illustrates an ADC system for removing errors in a signal chain, according to an embodiment.

FIG. 7 is a block diagram that illustrates an ADC system 700 for removing errors in a signal chain, according to an embodiment. The ADC system 700 includes a first signal path 701 and a second signal path 702 that separately operate in parallel with one another on a same analog input signal. The analog input signal may be a differential analog signal having a positive polarity input INPUT P and a negative polarity input INPUT N. An input to the first signal path 701 and an input to the second signal path 702 may be coupled together to receive the same analog input signal. The first and second signal paths 701, 702 may each include separate first and second analog front end circuits 704, 711 that are respectively cascaded with separate first and second ADC circuits 710, 718 to separately convert the analog input signal into first and second digital signals. The first signal path 701 may output the first digital signal, while the second signal path 702 may output the second digital signal.

The separate first and second analog front end circuits 704, 711 may include separate respective differential amplifiers 706, 714. Each amplifier 706, 714 may having a respective modulating chopper circuit 705, 712 at its differential input to chop the input differential signal according to a digital modulation pattern determined by a respective pattern generator circuit 720, 722. Each amplifier 706, 714 may also have a respective modulating chopper circuit 708, 716 at its differential output to de-chop the differential signal output by the respective amplifier 706, 714 according to a same digital modulation pattern used by the respective modulating chopper circuit 705, 712 at the input of the respective amplifier 706, 714. A gain of the amplifiers 706, 714 may be determined by a ratio of their respective input resistors RINP1, RINN1, RINP2, RINN2 and feedback resistors RFBP1, RFBN1, RFBP2, RFBN2. The modulation of the chopping frequency of the modulating chopper circuits 705, 712 may have the effect of modulating one or more error signals by the modulating chopper circuits 705, 712. In various embodiments, one or more of the modulating chopper circuits 705, 712 may be chopped according to a different digital modulation pattern than another of the modulating chopper circuits 705, 712. The different digital modulation patterns may be uncorrelated with each other.

Each of the differential amplifiers 706, 714 may be coupled to the differential input of the respective ADC circuit 710, 718 with which it is cascaded. The illustrated front end circuit comprising the amplifiers 706, 714 and respective modulating chopper circuits 705, 708, 712, 716 together with respective amplifier input resistors RINP1, RINN1, RINP2, RINN2 and feedback resistors RFBP1, RFBN1, RFBP2, RFBN2 comprise a single front end stage 703. In various embodiments, a plurality of front end stages 703 may be cascaded together. Each of the plurality of front end stages 703 may include a modulating chopper circuit that uses a different digital modulation pattern provided by a respective one of the pattern generator circuits 720, 722 than the other stages 703 in order to decorrelate the errors of each stage from the other stages. In various embodiments, each of the plurality of front end stages 703 may include different front end signal conditioning circuits and may use different amplifier configurations.

The modulation of the chopping frequency of the modulating chopper circuits 705, 712 may have the effect of modulating one or more error signals by the modulating chopping circuits 705, 712. In various embodiments, one of the modulating chopper circuits 705, 712 may chop the differential input signal according to a different digital modulation pattern than another of the modulating chopper circuits 705, 712. The different digital modulation patterns provided by respective pattern generator circuits 720, 722 may be uncorrelated with each other. The one or more digital modulation patterns may include a random sequence, a deterministic sequence, a pseudorandomn sequence, a maximal length sequence, and/or a noise-shaped sequence. In various embodiments, the random sequence may produce white noise, and the noise-shaped sequence may be implemented using delta-sigma modulation.

The ADC system 700 may also include digital error compensation circuits 724, 726 that compensate for errors in the respective first and second digital signals output by the respective first and second signal paths 701, 702, according to respective error compensation signals received from an error estimator circuit 730. The error estimator circuit 730 includes a demodulator circuit 732 that demodulates the one or more error signals included in a difference signal received from a difference circuit 728 according to corresponding one or more digital modulation patterns received from the pattern generator circuits 720, 722. Based on the demodulated error signals, the error estimator circuit 730 may estimate the one or more errors and generate corresponding one or more error compensation signals to compensate for the one or more errors.

The difference circuit 728 may generate the difference signal from compensated digital signals output by the digital error compensation circuits 724, 726. The first and second signal paths 701, 702 may include similar components arranged in a similar configuration, so that the difference signal computed by the difference of the digital signals output by the digital error compensation circuits 724, 726 may primarily include only noise and a residue of the one or more error signals modulated according to the digital modulation patterns output by the pattern generator circuits 720, 722 that is not corrected yet by the digital error compensation circuits 724, 726 according to the error compensation signals received from the error estimator circuit 730. The error estimator circuit 730 may iterate on appropriate error compensation signals to send to the digital error compensation circuits 724, 726 using the feedback loop between the digital error compensation circuits 724, 726 and the error estimator circuit 730 until the one or more errors are corrected and no error signals are received by the error estimator circuit 730 as part of the difference signal output by the difference circuit 728.

The error estimator circuit 730, demodulator circuit 732, digital error compensation circuits 724, 726, difference circuit 728, and averager circuit 765 may be embodiments of the respective error estimator circuit 145, demodulator circuit 147, digital error compensation circuits 152, 156, difference circuit 130, and averager circuit 165 described with reference to FIG. 1B. In various other embodiments, the error estimator circuit 730, demodulator circuit 732, digital error compensation circuits 724, 726, difference circuit 728, and averager circuit 765 may be replaced with embodiments of the difference circuit 130, error estimator circuit 140, demodulator circuit 143, and digital error compensation circuit 160 described with reference to FIG. 1A.

Figure 8:
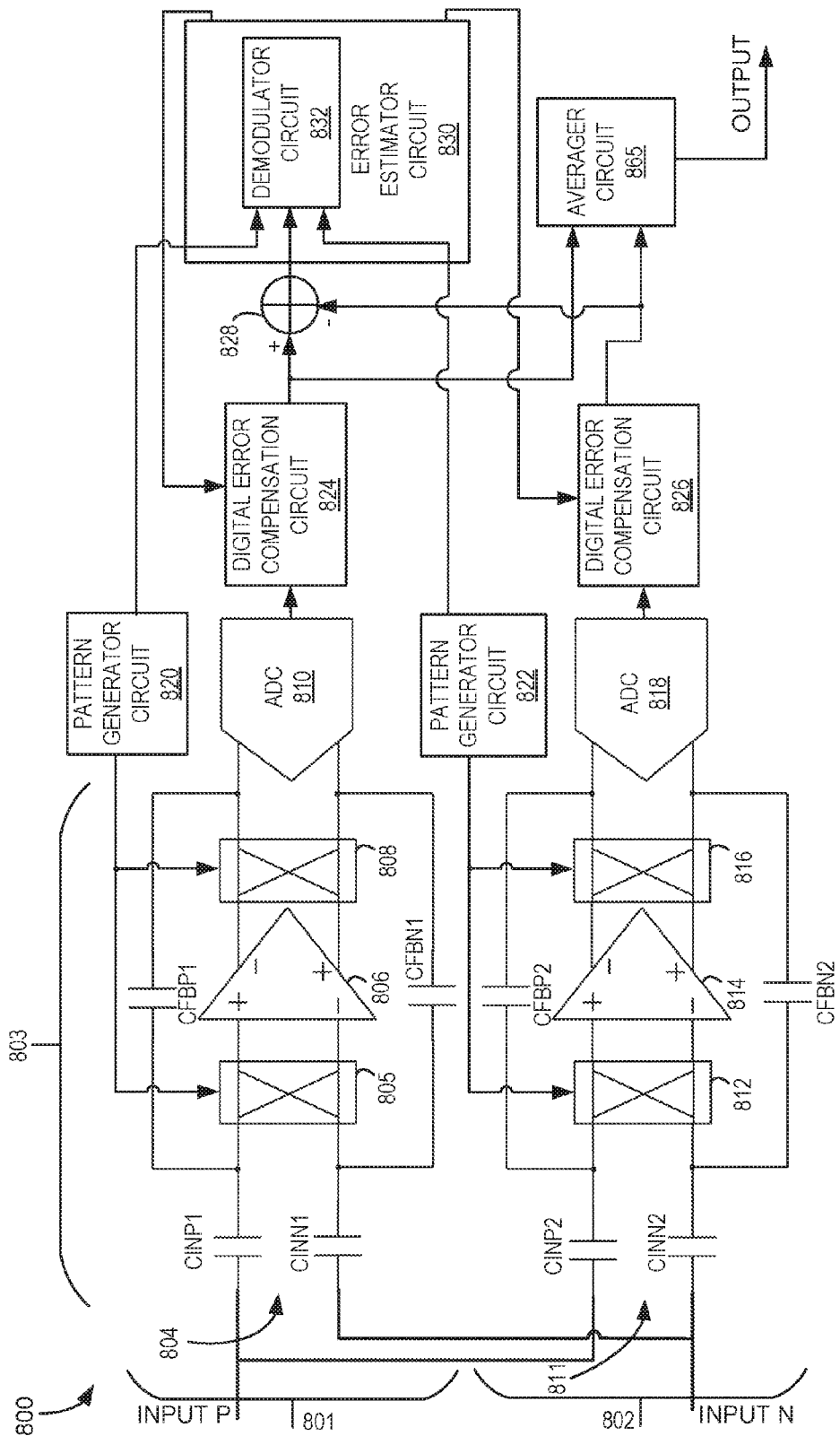
FIG. 8 is a block diagram that illustrates an ADC system for removing errors in a signal chain, according to an embodiment.

FIG. 8 is a block diagram that illustrates an ADC system 800 for removing errors in a signal chain, according to an embodiment. The ADC system 800 includes a first signal path 801 and a second signal path 802 that separately operate in parallel with one another on a same analog input signal. The analog input signal may be a differential analog signal having a positive polarity input INPUT P and a negative polarity input INPUT N. An input to the first signal path 801 and an input to the second signal path 802 may be coupled together to receive the same analog input signal. The first and second signal paths 801, 802 may each include separate first and second analog front end circuits 804, 811 that are respectively cascaded with separate first and second ADC circuits 810, 818 to separately convert the analog input signal into first and second digital signals. The first signal path 801 may output the first digital signal, while the second signal path 802 may output the second digital signal.

The separate first and second analog front end circuits 804, 811 may include separate respective differential amplifiers 806, 814. Each amplifier 806, 814 may having a respective modulating chopper circuit 805, 812 at its differential input to chop the input differential signal according to a digital modulation pattern determined by a respective pattern generator circuit 820, 822. Each amplifier 806, 814 may also have a respective modulating chopper circuit 808, 816 at its differential output to de-chop the differential signal output by the respective amplifier 806, 814 according to a same digital modulation pattern used by the respective modulating chopper circuit 805, 812 at the input of the respective amplifier 806, 814. A gain of the amplifiers 806, 814 may be determined by a ratio of their respective input capacitors CINP1, CINN1, CINP2, CINN2 and feedback capacitors CFBP1, CFBN1, CFBP2, CFBN2. The modulation of the chopping frequency of the modulating chopper circuits 805, 812 may have the effect of modulating one or more error signals by the modulating chopper circuits 805, 812. In various embodiments, one or more of the modulating chopper circuits 805, 812 may be chopped according to a different digital modulation pattern than another of the modulating chopper circuits 805, 812. The different digital modulation patterns may be uncorrelated with each other. Each of the differential amplifiers 806, 814 may be coupled to the differential input of the respective ADC circuit 810, 818 with which it is cascaded. The illustrated front end circuit comprising the amplifiers 806, 814 and respective modulating chopper circuits 805, 808, 812, 816 together with respective amplifier input capacitors CINP1, CINN1, CINP2, CINN2 and feedback capacitors CFBP1, CFBN1, CFBP2, CFBN2 comprise a single front end stage 803. In various embodiments, a plurality of front end stages 803 may be cascaded together. Each of the plurality of front end stages 803 may include a modulating chopper circuit that uses a different digital modulation pattern provided by a respective one of the pattern generator circuits 820, 822 than the other stages 803 in order to decorrelate the errors of each stage from the other stages. In various embodiments, each of the plurality of front end stages 703 may include different front end signal conditioning circuits and may use different amplifier configurations.

The modulation of the chopping frequency of the modulating chopper circuits 805, 812 may have the effect of modulating one or more error signals by the modulating chopping circuits 805, 812. In various embodiments, one of the modulating chopper circuits 805, 812 may chop the differential input signal according to a different digital modulation pattern than another of the modulating chopper circuits 805, 812. The different digital modulation patterns provided by respective pattern generator circuits 820, 822 may be uncorrelated with each other. The one or more digital modulation patterns may include a random sequence, a deterministic sequence, a pseudorandom sequence, a maximal length sequence, and/or a noise-shaped sequence. In various embodiments, the random sequence may produce white noise, and the noise-shaped sequence may be implemented using delta-sigma modulation.

The ADC system 800 may also include digital error compensation circuits 824, 826 that compensate for errors in the respective first and second digital signals output by the respective first and second signal paths 801, 802, according to respective error compensation signals received from an error estimator circuit 830. The error estimator circuit 830 includes a demodulator circuit 832 that demodulates the one or more error signals included in a difference signal received from a difference circuit 828 according to corresponding one or more digital modulation patterns received from the pattern generator circuits 820, 822. Based on the demodulated error signals, the error estimator circuit 830 may estimate the one or more errors and generate corresponding one or more error compensation signals to compensate for the one or more errors.

The difference circuit 828 may generate the difference signal from compensated digital signals output by the digital error compensation circuits 824, 826. The first and second signal paths 801, 802 may include similar components arranged in a similar configuration, so that the difference signal computed by the difference of the digital signals output by the digital error compensation circuits 824, 826 may primarily include only noise and a residue of the one or more error signals modulated according to the digital modulation patterns output by the pattern generator circuits 820, 822 that is not corrected yet by the digital error compensation circuits 824, 826 according to the error compensation signals received from the error estimator circuit 830. The error estimator circuit 830 may iterate on appropriate error compensation signals to send to the digital error compensation circuits 824, 826 using the feedback loop between the digital error compensation circuits 824, 826 and the error estimator circuit 830 until the one or more errors are corrected and no error signals are received by the error estimator circuit 830 as part of the difference signal output by the difference circuit 828.

The error estimator circuit 830, demodulator circuit 832, digital error compensation circuits 824, 826, difference circuit 828, and averager circuit 865 may be embodiments of the respective error estimator circuit 145, demodulator circuit 147, digital error compensation circuits 152, 156, difference circuit 130, and averager circuit 165 described with reference to FIG. 1B. In various other embodiments, the error estimator circuit 830, demodulator circuit 832, digital error compensation circuits 824, 826, difference circuit 828, and averager circuit 865 may be replaced with embodiments of the difference circuit 130, error estimator circuit 140, demodulator circuit 143, and digital error compensation circuit 160 described with reference to FIG. 1A.

Figure 9:
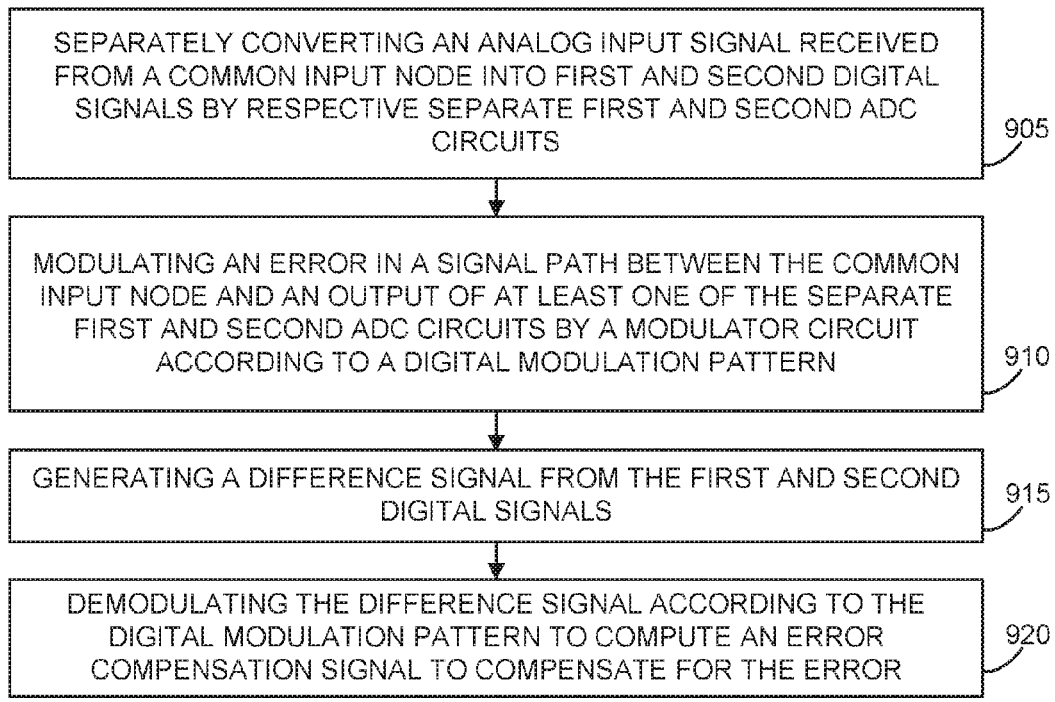
FIG. 9 is a block diagram that illustrates a method for removing errors in a signal chain of an ADC system, according to an embodiment.

FIG. 9 is a block diagram that illustrates a method for removing errors in a signal chain of an ADC system, according to an embodiment.

In an operation 905, an analog input signal received from a common input node may be separately converted into first and second digital signals by respective separate first and second ADC circuits.

In an operation 910, an error may be modulated in a signal path between the common input node and an output of at least one of the separate first and second ADC circuits by a modulator circuit according to a digital modulation pattern. The digital modulation pattern may be based on a random sequence, a deterministic sequence, a pseudorandom sequence, a maximal length sequence, or a noise-shaped sequence. In various embodiments, the random sequence may produce white noise, and the noise-shaped sequence may be implemented using delta-sigma modulation.

In an operation 915, a difference signal may be generated from the first and second digital signals by a difference circuit. The difference signal generated by the difference circuit from the first and second digital signals may primarily include only noise and the modulated error.

In an operation 920, the difference signal may be demodulated by a demodulator circuit according to the digital modulation pattern based upon which the error is modulated in operation 910 to compute an error compensation signal to compensate for the error. This operation 920 may be performed for each of the errors in the difference signal.

Any feature of any of the embodiments described herein may optionally be used in combination with any other embodiment. Also, any of the embodiments described herein may optionally include any subset of the components or features discussed herein.

VARIOUS NOTES & EXAMPLES

Each of the non-limiting examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

For example, while the impedance elements and the switches are shown in one order between the input terminals and the summing nodes in the drawings, this should not be construed as limiting, because in various embodiments, the impedance elements and the switches may be disposed in a different order while maintaining the same functional performance, according to the understanding of one of ordinary skill in the art in view of the teachings herein. In addition, a single impedance element in the drawings may be replaced by a plurality of different impedance elements while maintaining a same functional performance, and a single switch in the figures may be replaced by a plurality of different switches while maintaining a same functional performance, according to the understanding of one of ordinary skill in the art in view of the teachings herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

What is claimed is:

1. An analog to digital converter (ADC) system for removing errors in a signal chain, the system comprising:
    separate first and second ADC circuits having inputs communicatively coupled with a common input node to separately convert an analog input signal received from the common input node into first and second digital signals;
    a modulating chopper circuit to modulate an error by chopping the analog signal according to decorrelated first and second digital modulation patterns to produce resulting first and second chopped signals respectively provided to the first and second ADC circuits for conversion into the respective first and second digital signals;
    a multibit difference circuit to generate a multibit difference signal from the first and second digital signals; and
    a demodulator circuit to demodulate the difference signal according to at least one of first and second digital modulation patterns to compute an error compensation signal to compensate for at least one of the modulated error and a secondary error resulting from the modulation of the error.

2. The ADC system of claim 1, further comprising a digital error compensation circuit to compensate for the at least one of the modulated error and the secondary error in at least one of the first and second digital signals according to the error compensation signal.

3. The ADC system of claim 1, further comprising separate first and second analog front end circuits having inputs coupled together to receive a same analog input signal, the first and second analog front end circuits respectively cascaded with the first and second ADC circuits to provide analog signals processed from the analog input signal received from the common input node to the respective first and second ADC circuits.

4. The ADC system of claim 1, wherein the signal path includes an analog error compensation circuit to compensate for the at least one of the modulated error and the secondary error in the signal path according to the error compensation signal.

5. The ADC system of claim 4, wherein the analog error compensation circuit adds the error compensation signal to a source of the at least one of the modulated error and the secondary error.

6. The ADC system of claim 1, further comprising an averager circuit to generate an average signal from the first and second digital signals.

7. The ADC system of claim 6, further comprising a digital error compensation circuit to compensate for the at least one of the modulated error and the secondary error in the average signal according to the error compensation signal.

8. The ADC system of claim 1, wherein the modulating chopper circuit swaps a connection between each of a first and second analog front end circuits and a respective one of the first and second ADC circuits with a respective other of the first and second ADC circuits according to the digital modulation pattern.

9. A method of removing errors in a signal chain of an analog to digital converter (ADC) system, the method comprising:
    separately converting an analog input signal received from a common input node into first and second digital signals by respective separate first and second ADC circuits;
    modulating an error in a signal path between the common input node and an output of at least one of the first and second ADC circuits by a modulating chopper circuit chopping according to decorrelated first and second digital modulation patterns;
    generating a multibit difference signal from the first and second digital signals by a multibit difference circuit; and
    demodulating, by a demodulator circuit, the difference signal according to at least one of the first and second digital modulation patterns to compute an error compensation signal to compensate for at least one of the modulated error and a secondary error resulting from the modulation of the error.

10. The method of claim 9, further comprising compensating for the at least one of the modulated error and the secondary error in at least one of the first and second digital signals by a digital error compensation circuit according to the error compensation signal.

11. The method of claim 9, further comprising:
    receiving a same analog input signal from the common input node by separate first and second analog front end circuits respectively cascaded with the first and second ADC circuits;
    separately processing the analog input signal by the separate first and second analog front end circuits;
    providing the separate processed analog input signals to the respective first and second ADC circuits.

12. The method of claim 9, further comprising compensating for the at least one of the modulated error and the secondary error in the signal path by an analog error compensation circuit according to the error compensation signal.

13. The method of claim 12, wherein compensating for the at least one of the modulated error and the secondary error in the signal path by the analog error compensation circuit includes adding the error compensation signal to a source of the at least one of the modulated error and the secondary error.

14. The method of claim 9, further comprising averaging the first and second digital signals by an averager circuit to generate an average signal.

15. The method of claim 14, further comprising compensating for the at least one of the modulated error and the secondary error in the average signal by a digital error compensation circuit according to the error compensation signal.

16. The method of claim 9, further comprising swapping a connection between each of a first and second analog front end circuits and a respective one of the first and second ADC circuits with a respective other of the first and second ADC circuits by the modulating chopper circuit according to the digital modulation pattern.

17. The method of claim 9, wherein the digital modulation pattern is based on at least one of a pseudorandom sequence and a noise-shaped sequence.

18. An analog to digital converter (ADC) system for removing errors in a signal chain, the system comprising:
  a first signal path including
    a first ADC circuit having an input coupled to receive an analog signal input; and
    a first modulating chopper circuit in the first signal path to perform chopping according to a first chopping sequence;
  a second signal path including
    a second ADC circuit having an input to receive the analog signal input; and
    a second modulating chopper circuit in the second signal path to perform chopping according to a second chopping sequence decorrelated from the first chopping sequence;
  a multibit digital difference circuit that subtracts an output of the second signal path from an output of the first signal path to output a multibit difference signal; and
  an error estimator circuit that computes an error compensation signal by demodulating the difference signal according to at least one of the first chopping sequence and the second chopping sequence.

19. The ADC system of claim 18, further comprising:
  a first amplifier circuit having an input coupled with the first signal path downstream of the analog signal input and having an output coupled with the first signal path downstream of the input of the first amplifier circuit and upstream of the first ADC circuit; and
  a second amplifier circuit having an input coupled with the second signal path downstream of the analog signal input and having an output coupled with the second signal path downstream of the input of the second amplifier circuit and upstream of the second ADC circuit.

20. The ADC system of claim 18, wherein the first chopping sequence and the second chopping sequence are the same chopping sequence.

21. The ADC system of claim 1, wherein the error compensation signal is to compensate for the modulated error.

22. The ADC system of claim 1, wherein the error compensation signal is to compensate for the secondary error resulting from the modulation of the error.

* * * * *

UNITED STATES PATENT AND TRADEMARK OFFICE
CERTIFICATE OF CORRECTION

PATENT NO. : 9,859,907 B1  
APPLICATION NO. : 15/337774  
DATED : January 2, 2018  
INVENTOR(S) : Hongxing Li Page 1 of 1

It is certified that error appears in the above-identified patent and that said Letters Patent is hereby corrected as shown below:

In the Claims

In Column 27, Line 3, in Claim 18, after "including", insert --:--

In Column 27, Line 9, in Claim 18, after "including", insert --:--

Signed and Sealed this  
Eleventh Day of June, 2019

Andrei Iancu  
*Director of the United States Patent and Trademark Office*